United States Patent [19]
Ueda et al.

[11] Patent Number: 5,589,780
[45] Date of Patent: Dec. 31, 1996

[54] IC ANALYSIS SYSTEM AND ELECTRON BEAM PROBE SYSTEM AND FAULT ISOLATION METHOD THEREFOR

[75] Inventors: Koshi Ueda, Machida; Akira Goishi, Kazo; Masayuki Kuribara, Gyoda, all of Japan

[73] Assignee: Advantest Corporation, Tokyo, Japan

[21] Appl. No.: 312,953

[22] Filed: Sep. 30, 1994

Related U.S. Application Data

[62] Division of Ser. No. 181,584, Jan. 14, 1994, Pat. No. 5,528,156.

[30] Foreign Application Priority Data

| Jul. 30, 1993 | [JP] | Japan | 5-190431 |
| Jul. 30, 1993 | [JP] | Japan | 5-190449 |
| Sep. 21, 1993 | [JP] | Japan | 5-257624 |

[51] Int. Cl.⁶ .................................................. G01R 31/305
[52] U.S. Cl. ........................... 324/751; 250/310; 250/311
[58] Field of Search ............................ 324/751; 250/311, 250/310; 437/8

[56] References Cited

U.S. PATENT DOCUMENTS

| 3,549,999 | 12/1970 | Norton | 324/751 |
| 4,706,019 | 11/1987 | Richardson | 324/751 |
| 5,089,774 | 2/1992 | Nakano | 324/751 |
| 5,164,666 | 11/1992 | Wolfgang et al. | 324/751 |
| 5,270,643 | 12/1993 | Richardson | |

*Primary Examiner*—Ernest F. Karlsen
*Assistant Examiner*—Russell M. Kobert
*Attorney, Agent, or Firm*—Staas & Halsey

[57] ABSTRACT

A stop pattern setting part 203 is provided which permits setting therein a plurality of patterns for stopping the test pattern updating operation of a test pattern generator 210, and upon each generation of the test patters set in the stop pattern setting part 203, the test pattern generator 210 is stopped from the pattern updating operation. Each time the test pattern stops, a stop signal is applied to an electron beam probe system 300, causing it to start an image data acquiring operation. Upon completion of the image data acquisition, a write completion signal generating part 308 generates a write completion signal, which is applied to the test pattern generator 210 to cause it to resume the pattern updating operation. By applying different test patterns to a device under test alternately with each other and displaying image data of the difference between resulting pieces of image data, a potential contrast image can be improved.

8 Claims, 18 Drawing Sheets

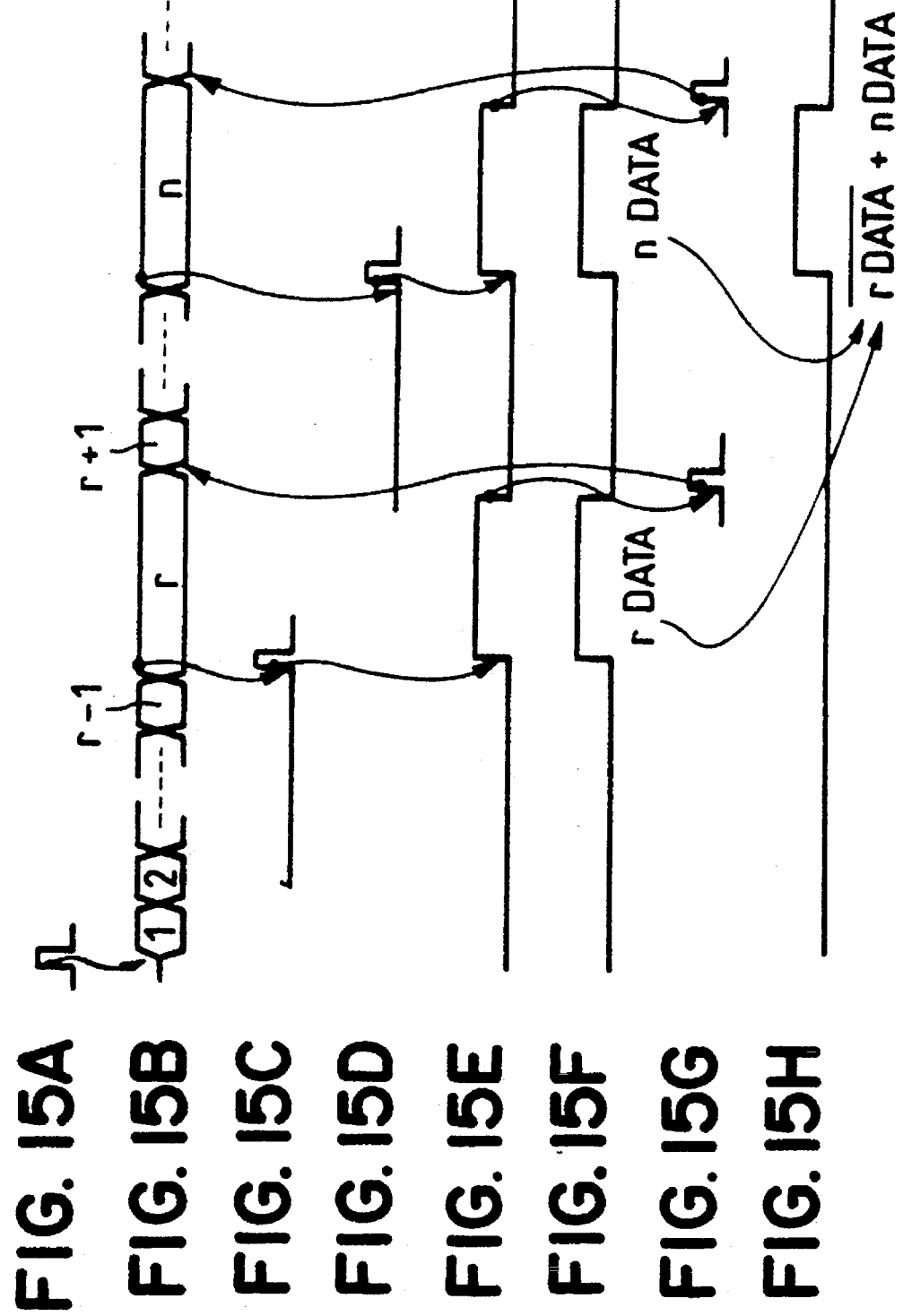

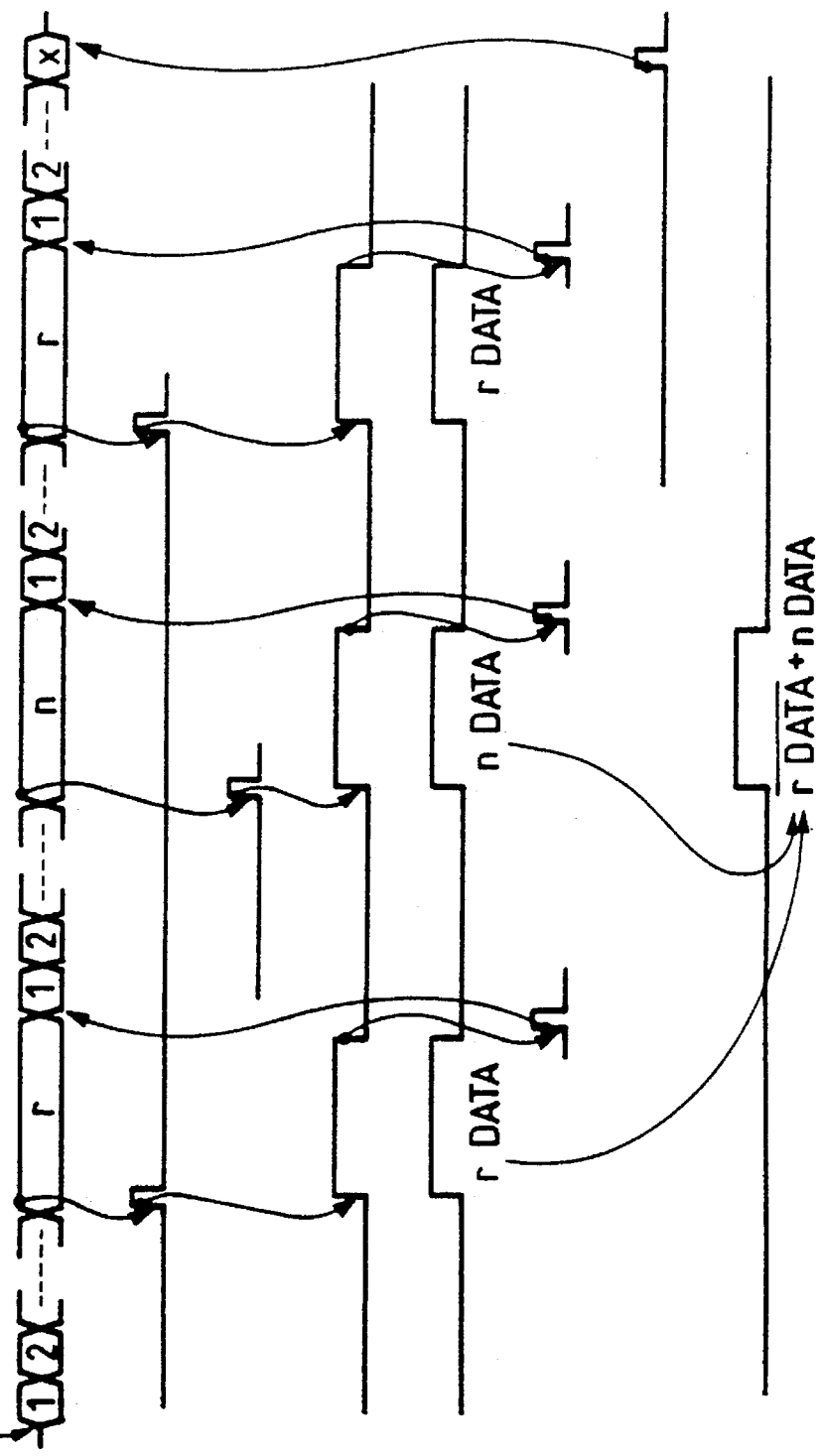

FIG. 18

TABLE I

| ITEM | NORMAL IC | | | DEFECTIVE IC | | | IMAGE DIFFERENCE | FALT ISOLATION PROBLEM |
|---|---|---|---|---|---|---|---|---|
| | LOGIC OF PTN r | LOGIC OF PTN n | IMAGE CONT | LOGIC OF PTN r | LOGIC OF PTN n | IMAGE CONT | | |
| 1 | H | H | GRAY | H | L | W | YES | NO |
| 2 | | | | L | L | G | NO | YES |
| 3 | | | | H | H | G | NO | NO |
| 4 | | | | L | H | B | YES | NO |
| 5 | L | H | BLACK | H | L | W | YES | NO |
| 6 | | | | L | L | G | YES | NO |
| 7 | | | | H | H | G | YES | NO |
| 8 | | | | L | H | B | NO | NO |
| 9 | H | L | WHITE | H | L | W | NO | NO |
| 10 | | | | L | L | G | YES | NO |
| 11 | | | | H | H | G | YES | NO |
| 12 | | | | L | H | B | YES | NO |
| 13 | L | L | GRAY | H | L | W | YES | NO |
| 14 | | | | L | L | G | NO | NO |
| 15 | | | | H | H | G | NO | YES |
| 16 | | | | L | H | B | YES | NO |

FIG. 20

TABLE II

| ITEM | NORMAL IC | | | DEFECTIVE IC | | | IMAGE DIFFERENCE | FALT ISOLATION PROBLEM |
|---|---|---|---|---|---|---|---|---|
| | LOGIC OF PTN r | LOGIC OF PTN n | IMAGE CONT | LOGIC OF PTN r | LOGIC OF PTN n | IMAGE CONT | | |
| 1 | L | H | BLACK | L | L | G | YES | NO |
| 2 | | | | L | H | B | NO | NO |
| 3 | L | L | GRAY | L | L | G | NO | NO |
| 4 | | | | L | H | B | YES | NO |

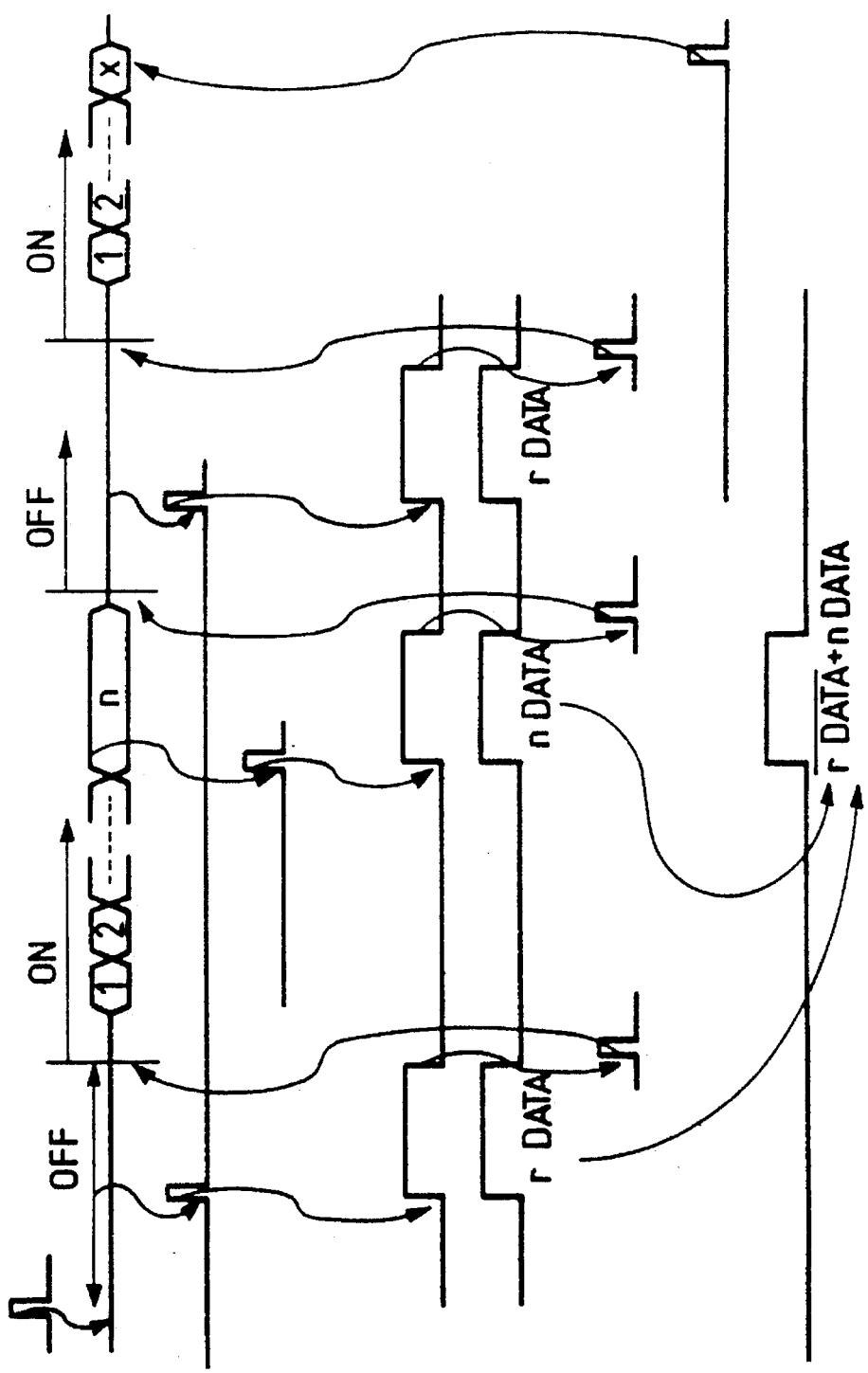

IC ANALYSIS SYSTEM AND ELECTRON BEAM PROBE SYSTEM AND FAULT ISOLATION METHOD THEREFOR

This application is a division of application Ser. No. 08/181,584, filed Jan. 14, 1994, now U.S. Pat. No. 5,528,156.

BACKGROUND OF THE INVENTION

The present invention relates to an electron beam probe system which irradiates an IC under test with an electron beam, measures the quantity of secondary electrons emanating from each irradiated point and displays the potential distribution in the IC as a potential contrast image that is used to locate a fault, for example. The invention also pertains to an IC analysis system and a fault isolation method that utilize such an electron beam probe system.

DESCRIPTION OF THE RELATED ART

Heretofore, there has been used an IC analysis system of the type that sweeps and irradiates (namely, irradiates while scanning) the surface of a chip of an IC under test (hereinafter also referred to generally as a device or an element under test DUT) chip with an electron beam, measures the quantity of secondary electrons emitted from the IC chip at each irradiated point as an electrical signal, processes the electrical signal as image data to display the potential distribution in the IC as a potential contrast image, and compares it with a similar potential contrast image of a non-defective IC to pinpoint a fault of the IC under test, for example.

FIG. 1 shows the general construction of this conventional type of IC analysis system. Reference numeral 100 denotes generally the IC analysis system, which is made up of an IC tester 200 and an electron beam probe system 300.

The IC tester 200 provides a test pattern signal to an IC under test DUT placed in the electron beam probe system 300. The conventional IC tester 200 includes: a test pattern generator 210 which as a plurality of test patterns stored at addresses therein and generates a test pattern signal composed of a series of test patterns for application to the device under test DUT, hereinafter a test pattern also referred to as a pattern; a main control part 204 which controls, in accordance with a program which describes an analysis procedure, a pattern generating sequence of the test pattern generator 210 such as the start of a test pattern generation, a pause of update of the pattern, a repetition of a desired pattern sequence, the end of the pattern generation, for instance; a start switch 201 for starting the generation of a test pattern signal; a stop switch 202 for stopping the generation of the test pattern signal at an arbitrary point of time; and a stop pattern setting part 203 in which a stop pattern is set for stopping a test pattern having the same pattern as that of this stop pattern from being updated in the test pattern generator 210 when this same test pattern is generated from the test pattern generator 210. The main control part 204 can always monitor the stop pattern set in the stop pattern setting part 203 and a test pattern generated from the test pattern generator 210. Accordingly, the main control part 204 always compares the stop pattern and stops the updating operation of the test pattern generator 210 when both patterns of the stop pattern and the test pattern are identical.

The electron beam probe system 300 is made up of: a column 301 which irradiates the device under test DUT with an electron beam EB; a chamber 302 which is provided just under the column 301 to hold the device under test DUT in a vacuum; a stage 303 which is provided in the chamber 302 to shift the position of the device under test DUT in the X-Y direction; a sensor 304 for measuring the quantity of secondary emission from the device under test DUT as an electrical signal; an image data processor 305 which acquires or receives, as image data, the electrical signal detected by the sensor 304 and stores it in an internal memory; a monitor 306 which displays, as a potential contrast image, the image data read out of the image data processor 305; and a column control part 307 which controls the emission of the electron beam EB, its quantity of emission (a current value), acceleration voltage, scanning speed, scanning area, etc.

When the main control part 206 detects that the test pattern generator 210 has generated the same test pattern as the stop pattern set in the stop pattern setting part 203, the main control part 204 controls to stop temporarily the test pattern generator 210 from updating the test pattern now being generated therefrom so that the test pattern generator 210 can continue to generate the identical test pattern. At the same time, the main control part 204 supplies the image data processor 304 and the column control part 307 with a stop signal STP representing that the test pattern updating operation of the test pattern generator 210 has stopped. Upon receiving the stop signal STP, the column control part 307 effects control to emit the electron beam EB and the image data processor 305 starts to acquire image data.

Conventionally, the time for pause of the test pattern is set a little longer than the time required to write the image data into the image data processor 305 in order to afford a margin of time. On account of this, a change in the conditions for writing the image data into the image data processor 305 calls for a change in the test pattern pause time as well; hence, the prior art system has the defect of poor operability.

That is, the electron beam acceleration voltage, scanning speed and scanning area must be set for acquiring the image data, and if these conditions are changed or modified, the time for acquiring the image data will change. Consequently, when the conditions for acquiring the image data are changed, the test pattern pause time also needs to be changed accordingly. This involves operating both of the IC tester 200 and the electron beam probe system 300, and hence is troublesome.

On the other hand, the conditions for writing the image data into the image data processor 305 need to be changed in accordance with the purpose of each test. In particular, in the case of an IC chip wherein the device under test DUT is covered all over its surface with an insulating film as a protective layer, it is necessary to observe or measure potentials corresponding to those of wiring conductors underlying the insulating film. It is difficult, however, to detect, as potential contrast images, the potential distributions of the wiring conductors of the IC chip covered all over its surface with the insulating film. The quantity of secondary emission of electrons from the chip surface irradiated by the electron beam depends on the surface potential of the IC chip. When the surface potential is positive, some of the secondary electrons emitted return to the chip surface. Hence the quantity of secondary electrons that reach the sensor is small. When the surface potential is negative, the secondary electrons are readily emitted and they do not return to the chip surface, and hence a large amount of secondary electrons reach the sensor. For instance, when the surface of the insulating film has a negative potential, the surface is charged in the positive direction as the secondary emission of electrons proceeds, and the quantity of secondary emission gradually decreases. Conversely, when the surface of the insulating film has a positive potential, the potential decreases in the negative direction by electrons that are injected thereinto by the electron beam. In either case, the surface potential reaches equilibrium at a certain potential. That is, when the surface of the insulating film is irradiated with an electron beam, the potential distribution of the IC chip surface becomes gradually uniform and ultimately disappears owing to the storage of charges on the insulating film that is cause by the secondary emission of electrons in proportion to the electron beam irradiating time, and as a result, it is impossible to detect potential contrast images desired to obtain.

FIGS. 2A, 2B and 2C show how the potential distribution of the IC chip surface disappears as mentioned above. FIG. 2A shows potential contrast image of conductors $L_1$, $L_2$, $L_3$ and $L_4$ underlying the insulating film when they are supplied with L-logic, H-logic, L-logic and H-logic potentials, respectively. As shown, the application of the L-logic potential (a voltage close to zero volt or negative potential) provides a white potential contrast image (which means that the quantity of secondary electrons reaching the sensor is large). The application of the H-logic potential (a voltage above zero volt) provides a black potential contrast image (which means that the quantity of secondary electrons reaching the sensor is small). In this instance, an insulated substrate PB has a potential intermediate between the L-logic and H-logic potentials and is displayed in gray.

FIG. 2B show potential contrast images appearing 0.1 to 0.3 seconds after the irradiation and scanning by the electron beam EB, and FIG. 2C show the states of the potential contrast images several seconds thereafter. As will be seen from FIG. 2, when the electron beam EB is applied, the potential contrast rapidly lowers and after several seconds the potential contrast disappears as depicted in FIG. 2C. Thus, necessary image data can be obtained only when the potential contrast is in such a state as shown in FIG. 2A. It is difficult, however, to obtain a clear image of excellent SN ratio by a single fetch of image data. For instance, even if the image data is acquired a plurality of times and averaged to improve the SN ratio of the image, it cannot satisfactorily be enhanced because of the rapid decrease in the potential contrast.

Owing to the presence of such a potential contrast lowering phenomenon, the conditions for acquiring the image data (the area for scanning by the electron beam, the current value of the electron beam, etc.) are changed with high frequency. Hence, each time the conditions for acquiring the image data are changed, the time length for which the updating of the test pattern is suspended also needs to be reset—this impairs the operability of the system. Furthermore, the potential contrast lowering phenomenon introduces the possibility that the potential contrast image of a defective part of an IC is indistinguishable from the potential contrast image of the corresponding part of a non-defective IC.

SUMMARY OF THE INVENTION

A first object of the present invention is to provide an electron beam probe system which permits enhancement of its operability and an IC analysis system using such an electron beam probe system.

A second object of the present invention is to provide an electron beam probe system which retains potential contrast images unchanged even in the presence of the potential contrast lowering phenomenon and an IC analysis system which uses such an electron beam probe system.

A third object of the present invention is to improve the picture quality of potential contrast images which represent the potential distribution of wiring conductors in an IC chip to which a desired test pattern is being applied.

A fourth object of the present invention is to provide an inspection method which makes it possible to distinguish between a potential contrast image of a defective portion of an IC and the potential contrast image of the counterpart of a nondefective IC even when the potential contrast decreases.

According to a first aspect of the present invention, the IC tester comprises a test pattern generator which generates test patterns while updating them one after another, a stop pattern setting part which sets a test pattern for stopping the updating of the test patterns, and a main control part which controls the test pattern generator to stop its test pattern updating operation but keep the generation of the test pattern set in the stop pattern setting part and outputs a pattern stop signal representing the suspension of the test pattern updating operation. When supplied with a write completion signal representing the completion of acquiring image data from the electron beam probe system, the main control part causes the test pattern generator to resume the pattern updating operation. The electron beam probe system comprises an image data processor which starts to write thereinto image data when receiving the pattern stop signal from the main control part, and a write completion signal generator for generating the write completion signal which indicates that the image data processor has written thereinto required image data.

According to a second aspect of the present invention, the IC tester comprises a test pattern generator which generates test patterns while updating them one after another, a stop pattern setting part which sets at least first and second test patterns for temporarily stopping the updating of the test patterns, and a main control part which controls the test pattern generator to stop its test pattern updating operation but keep the generation of one of the test patterns set in the stop pattern setting part and outputs a pattern stop signal representing the suspension of the test pattern updating operation. The electron beam probe system comprises an image data processor which starts to write thereinto image data when receiving the pattern stop signal from the main control part, and a mode switching part which is switchable between a first operation mode in which the first test pattern is generated, the test pattern updating operation is suspended, the acquisition of image data is inhibited in response to the pattern stop signal and the IC under test is irradiated with a scanning electron beam, and a second operation mode in which the second test pattern is generated, the test pattern updating operation is suspended and image data is acquired while at the same time the IC under test is irradiated with a scanning electron beam.

According to a third aspect of the present invention, the IC tester comprises a test pattern generator which applies test patterns to the device under test while updating them one after another, a stop pattern setting part which sets at least two test patterns for suspending the pattern updating operation of the test pattern generator, and a main control part which controls the test pattern generator to stop its updating operation whenever it generates each test pattern set in the stop pattern setting part, and outputs a pattern stop signal upon each suspension of the test pattern updating operation. The electron beam probe system comprises at least two image data processors which write thereinto image data in response to the pattern stop signals that the main control part outputs upon generation of the two stop patterns, a calculating part which calculates the difference between the image data written acquired into the two image data processors, and a monitor for displaying image data corresponding to the difference calculated by the calculating part.

According to a fourth aspect of the present invention, first image data is obtained by irradiating the device under test with a scanning electron beam in a state wherein the power supply to the device under test is held OFF, and second image data is obtained by irradiating the device under test with a scanning electron beam in a state wherein the power supply to the device under test is held ON and a predetermined pattern is applied thereto. The difference between the first and second pieces of image data is calculated and the image data corresponding to the difference is displayed.

With the construction according to the first aspect of the invention, when the image data processor has acquired or written thereinto required image data, the write completion signal generator generates the write completion signal indicating the completion of acquisition of the image data. The test pattern generator responds to the write completion signal to start its test pattern updating operation. Hence, there is no need of setting a test pattern stop or suspension time in the IC tester, and the acquisition of image data and the start and stop of the test pattern can automatically be repeated. Moreover, by setting the test pattern generation in a repeated generation mode, it is possible to repeatedly obtain image data from the device under test supplied with the same test pattern.

With the construction according to the second aspect of the invention, it is possible to make the potential contrast in the surface of the device under test different from the potential distribution resulting from the application of the second test pattern and desired to actually obtain therefrom an image, by only irradiating the device under test with an electron beam when the first test pattern is generated. By this, a potential contrast image can always be obtained in a portion where the potentials by the first and second test patterns are reverse in polarity. This produces an effect of improving the picture quality.

With the construction according to the third aspect of the invention, by irradiating the device under test with the scanning electron beam and acquiring the image data both at the times of generating the first and second test patterns and by obtaining the difference between the image data obtained with the first test pattern and the image data with the second test pattern, only a portion where the applied patterns were different in logic can be displayed as a potential contrast image. In this instance, since the difference between two pieces of image data is obtained, the potential contrast of the portion where the first and second test patterns applied thereto were reverse in logic is emphasized-this improves the image quality, and hence provides a clear image.

With the construction according to the fourth aspect of the invention, a defective part of the IC under test can be displayed in distinction from the corresponding part of a non-defective IC by displaying image data of the difference between image data in the OFF period of the power supply to the IC under test and image data resulting from the application of a desired test pattern.

BRIEF DESCRIPTION OF THE DRAWINGS

FIGS. 13A–E are waveform diagram for explaining the formation of the potential contrast images shown in FIG. 12;

FIGS. 15A–H are waveform diagrams for explaining an example of operation of the FIG. 14 embodiment;

FIGS. 16A–I are waveform diagrams for explaining another example of operation of the FIG. 14 embodiment;

FIG. 18 is a table showing the relationship of differential contrast images of an non-defective IC and a defective IC for each logic combination of the patterns r and n;

FIG. 20 is a table showing the relationship of differential contrast images of non-defective and defective ICs for each combination of the L-logic and the logic of the pattern n during the power OFF period; and FIGS. 21A–I are other timing charts for effecting the fault locating method according to the fourth aspect of the present invention.

DESCRIPTION OF THE PREFERRED EMBODIMENTS

Figure 1:
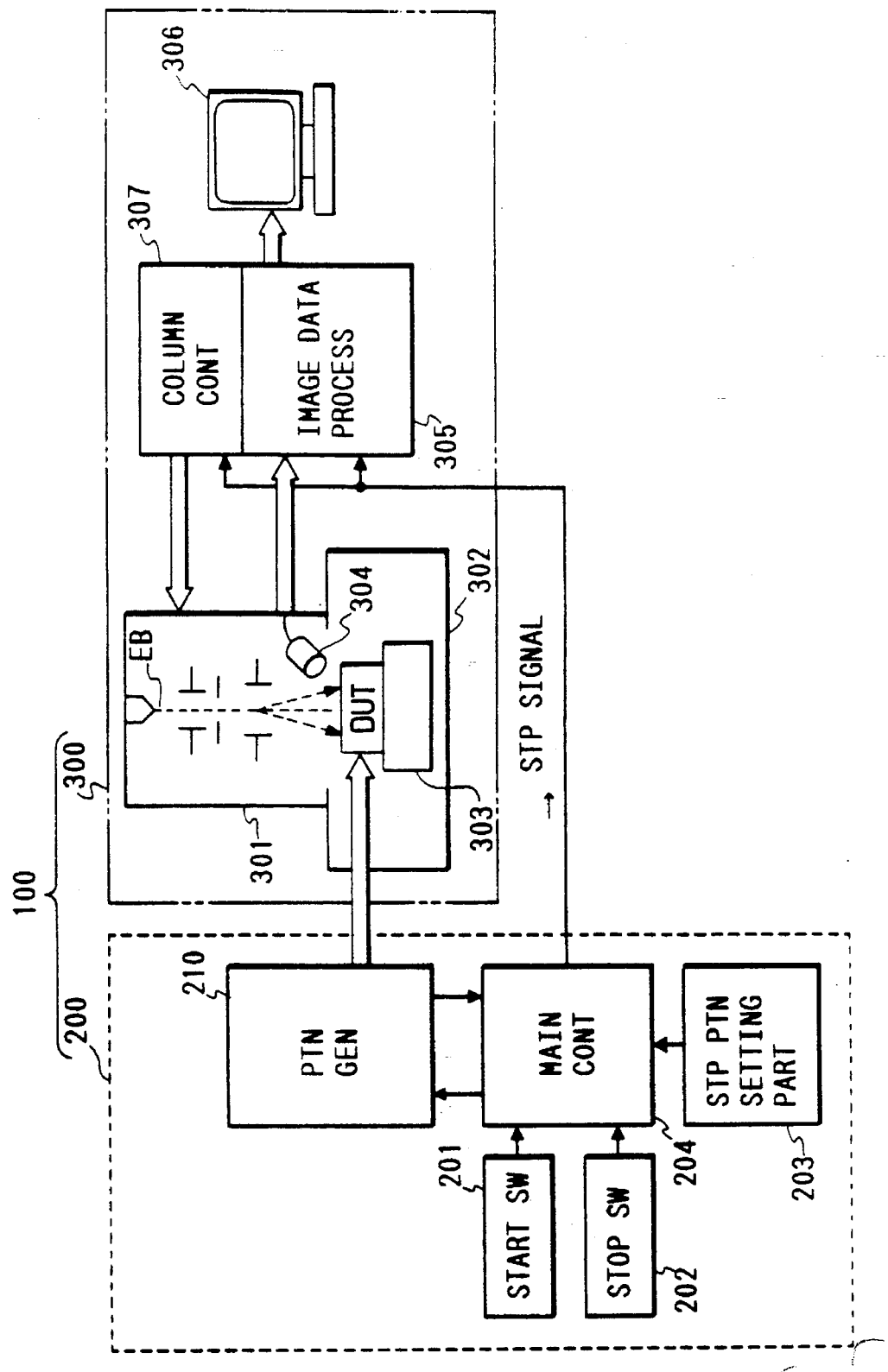
FIG. 1 is a block diagram for explaining the prior art.
Figure 2A:
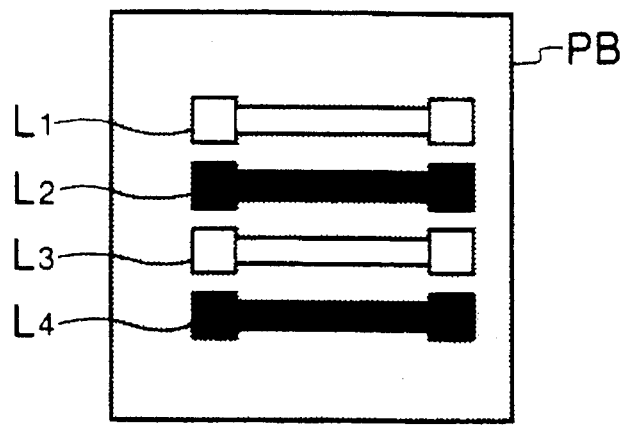
FIG. 2A is a diagram showing an example of potential contrast images produced by the irradiation with a scanning electron beam immediately after the updating of a test pattern.
Figure 2B:
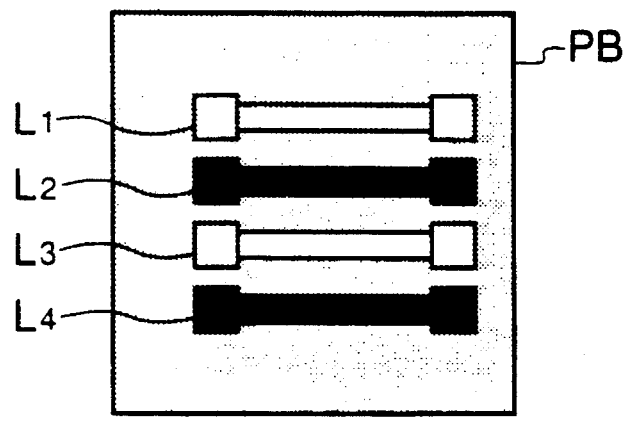
FIG. 2B is a diagram showing an example of potential contrast images obtainable a little after the state of FIG. 2A.
Figure 2C:
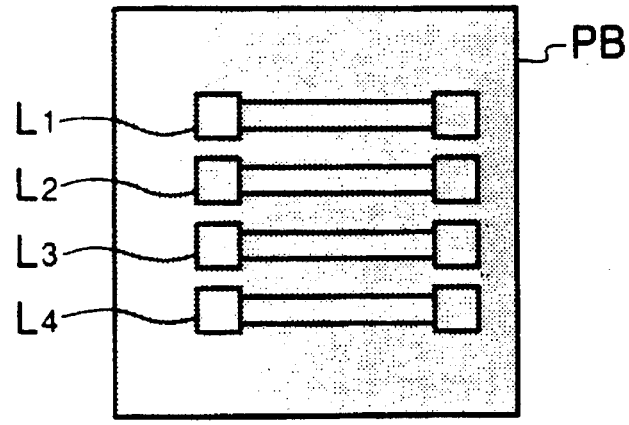
FIG. 2C is a diagram showing an example of potential contrast images obtainable after a certain elapsed of time in the state of FIG. 2B.
Figure 3:
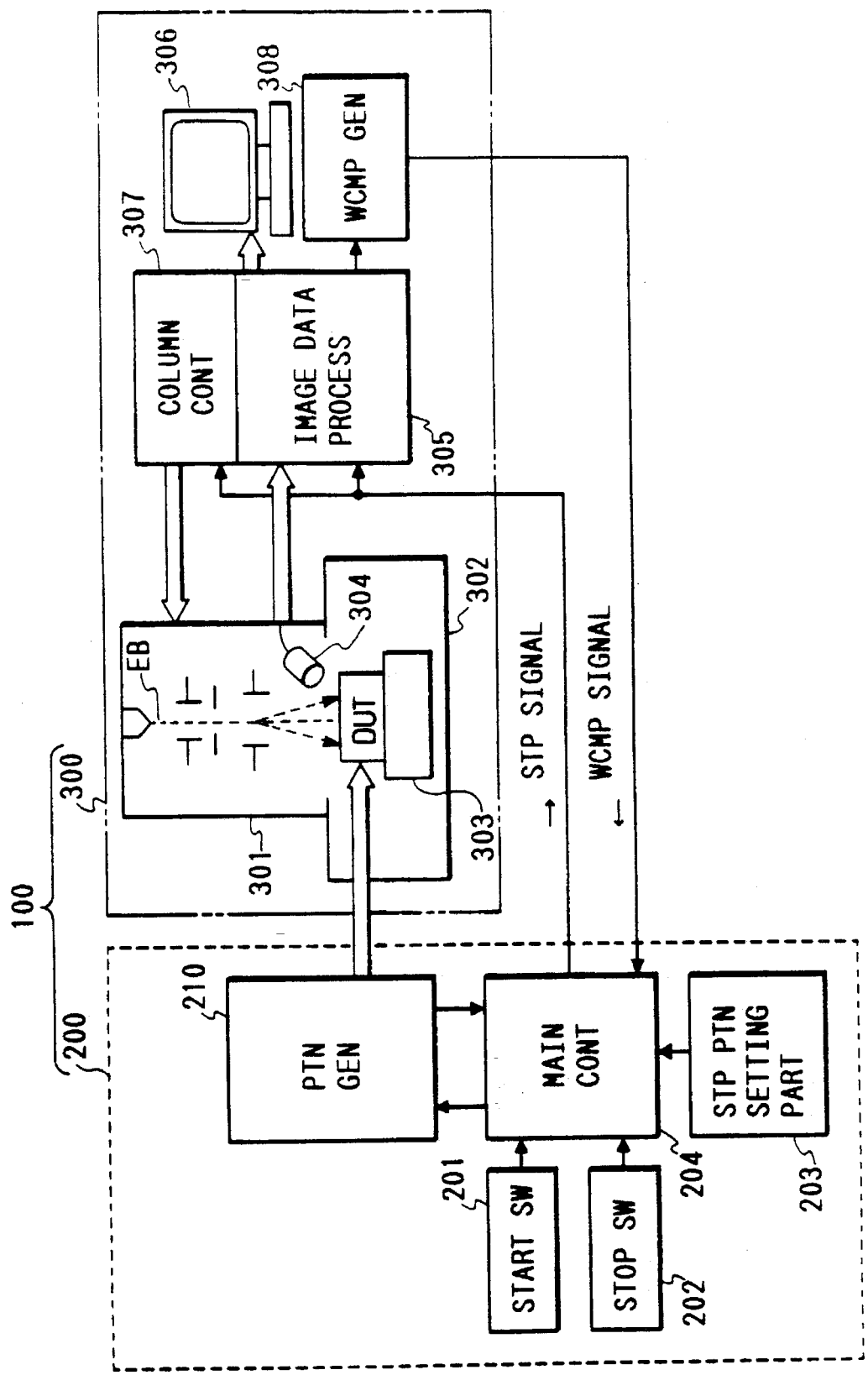
FIG. 3 is a block diagram illustrating an embodiment of the IC analysis system according to the first aspect of the present invention.

FIG. 3 illustrates, in block form, an embodiment of the IC analysis system employing the electron beam probe system 300 according to the first aspect of the present invention. The parts corresponding to those in FIG. 1 are identified by the same reference numerals. The structural feature according to the first aspect of the invention is the provision of a write completion signal generator part 308 in the electron beam probe system 300. The write completion signal generating part 308 generates a write completion signal WCMP when detecting that the image data processor 305 having an internal memory has completed the acquisition of image data. The write completion signal WCMP is input into the main control part 204 of the IC tester 200.

Figure 4:
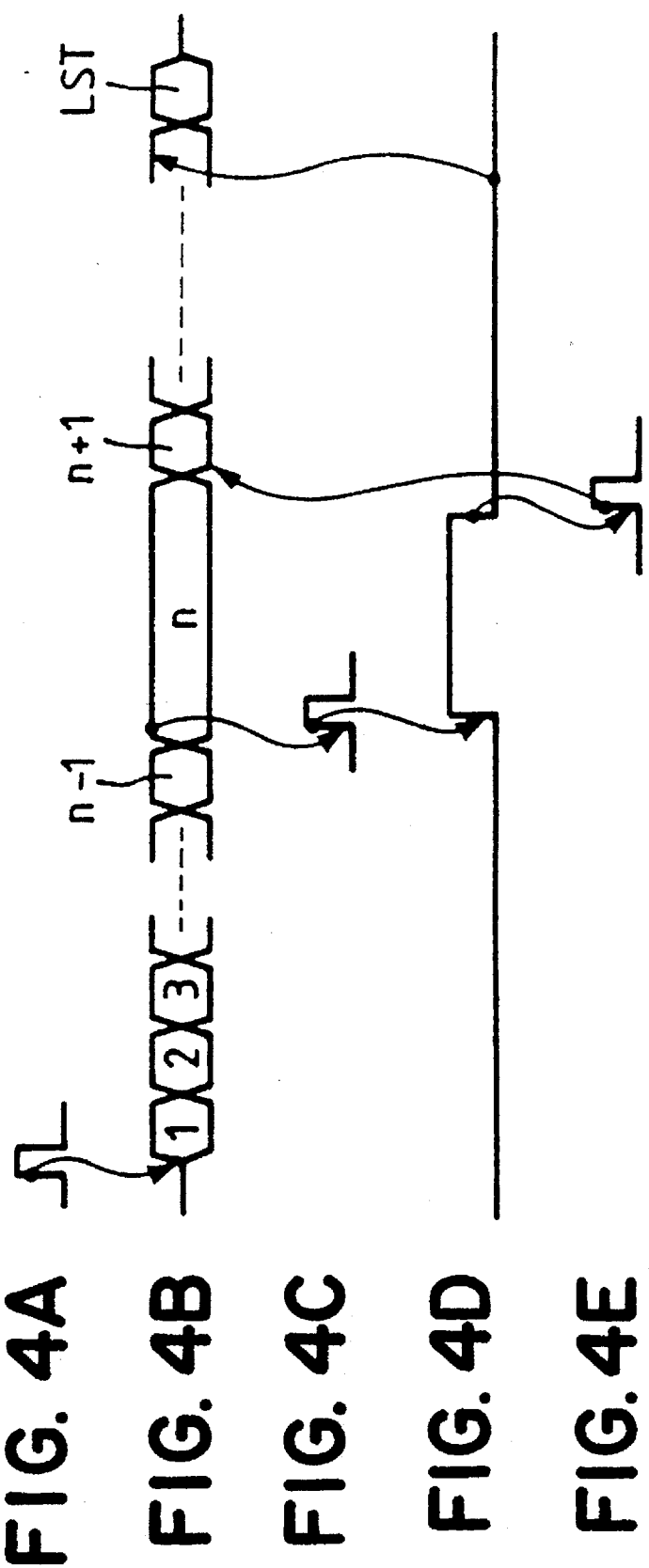
FIGS. 4A–E are waveform diagrams for explaining an example of operation of the FIG. 3 embodiment.
Figure 5:
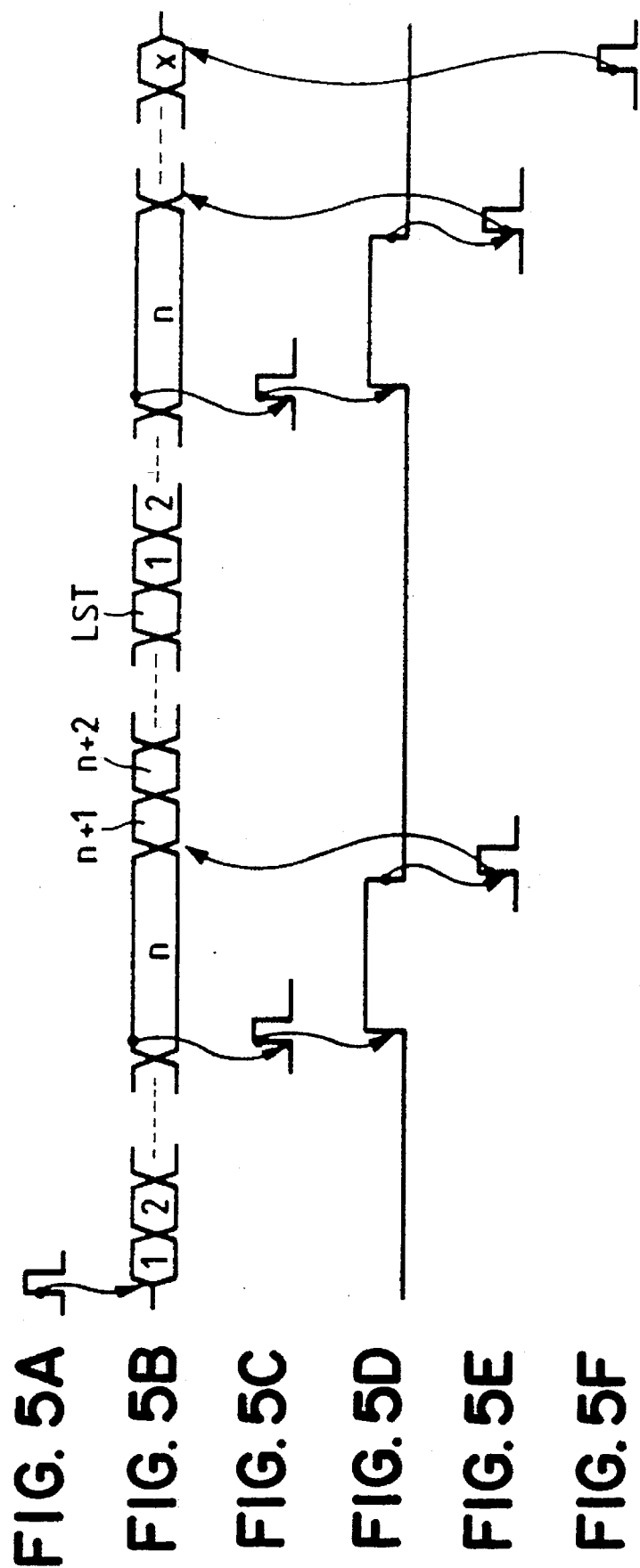
FIGS. 5A–F are waveform diagrams for explaining another example of operation of the FIG. 3 embodiment.
Figure 6:
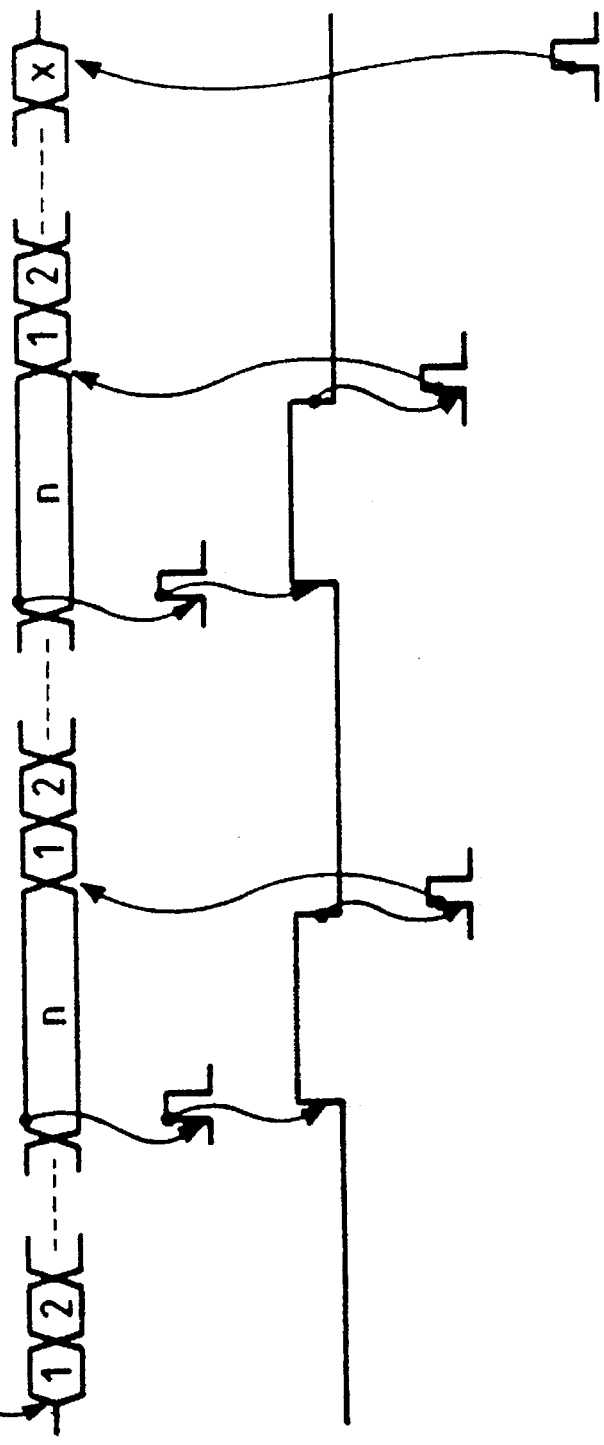
FIGS. 6A–F are waveform diagrams for explaining still another example of operation of the FIG. 3 embodiment.

Upon receiving the write completion signal WCMP, the main control part 204 provides to the test pattern generator 210 a command for cancelling the pause state of the test pattern updating operation thereof. Thus, the test pattern generator 210 is released from the stopped state of the test pattern updating operation and resumes the test pattern updating operation. That is, according to the first aspect of the present invention, assuming that a stop pattern n, for example, has been set in the stop pattern setting part 203 (n is a positive integer and "pattern n" denotes that n-th pattern in the test pattern generating sequence from the test pattern generator 210. In this embodiment, the setting of the stop pattern n means that when the n-th test pattern having the same pattern as that of the stop pattern n is generated from the test pattern generator 210, the n-th test pattern is not updated in the test pattern generator 210), the main control part 204 controls to stop the test pattern generator 210 from performing the updating operation of the n-th test pattern each time the n-th test pattern is generated from the test pattern generator 210 and to hold the test pattern generator 210 in the state that the n-th test pattern is continuously generated therefrom. Generally, since a series of test patterns are stored at respective addresses in the test pattern generator 210, a stop command which specifies only an address of the test pattern generator 210 may be set in the stop pattern part 203 instead of a stop pattern. In such case, each time the test pattern stored at the address specified by the stop command is generated, the main control part 204 controls to stop the test pattern generator 210 from performing the updating operation of this test pattern. FIGS. 4A–E show examples so of its operation. In FIG. 4A shows a start signal and FIG. 4B a test pattern signal which is composed of a series of test patterns 1, 2, . . ., n, . . . , LST where LST denotes the last, and "pattern LST" represents the test pattern generated last in the test pattern generating sequence. When the n-th pattern of the test pattern signal is generated from the test pattern generator 210, the main control part 204 causes the test pattern generator 210 to stop its pattern updating operation and holds the test pattern generator 210 in the state that the pattern n is continually generated therefrom, and at the same time the main control part 204 outputs the stop signal STP representing that the test pattern updating operation has stopped. The stop signal STP is applied to the image data processor 305 to cause it to start the acquisition of image data. FIG. 4D shows an image data acquisition period during which the n-th test pattern is continuously applied to the IC under test DUT.

The write completion signal generating part 308 can identify the completion of the acquisition of image data, for example, by detecting a vertical blanking signal representing that the sweep of the electron beam EB on the surface of the IC under test DUT has completed one frame. If the write completion signal generator 308 is adapted to generate the write completion signal WCMP when it detects one or a desired number of vertical blanking signals representing the above-mentioned condition, respectively, it is possible to generate the write completion signal WCMP when the electron beam EB has scanned one or desired number of frames. FIG. 4E shows the write completion signal WCMP.

When the write completion signal WCMP is applied to the main control part 204, the main control part 204 causes the test pattern signal generator 210 to be released from the pause state of the test pattern updating operation so that the test pattern generator 210 resumes generation and updating operation of test patterns following the test pattern n, namely, from the test pattern last pattern LST as shown in FIG. 4B. In the case where the generation of a series of test patterns that is, the test pattern signal is set to once, the test pattern generator 210 stops to generate the test pattern signal after generating the last pattern LST.

In the case where the test pattern generator 210 is set to repeat the generation of a test pattern signal composed of a series of test patterns, it automatically stops to effect its test pattern updating operation upon each generation of the test pattern n, restarts after the completion of the acquisition of image data and returns to the first test pattern namely, "the test pattern 1" after the generation of the last pattern LST, thereafter repeating the generation of the test pattern signal under control of the main control part 204, as shown in FIG. 5A–F Incidentally, it is also possible to return the operation of the test pattern generator 210 to the generation of the first test pattern after acquisition of image data as shown in FIG. 6A–F. At any rate, the IC analysis system according to the present invention can acquire, a plurality of times, image data on the surface of the IC under test DUT to which the specified test pattern n is continuously applied. The pattern generator 210 can be stopped by the stop switch 202.

As mentioned above, according to the first aspect of the present invention, start of a pattern generating operation and stop of a pattern updating operation of the test pattern generator 210 in the side of the IC tester 200 are interlocked with the image data acquiring operation in the side of the electron beam probe system 300 only by setting in the stop pattern setting part 203 a test pattern which is continuously applied to the surface of the IC under test DUT the potential contrast image of which at that time is desired to observe, or an address in the test pattern generator 210 at which the above test pattern is stored; hence, even if the conditions for acquiring the image data are changed, the setting of the IC tester 200 need not be changed.

Figure 7:
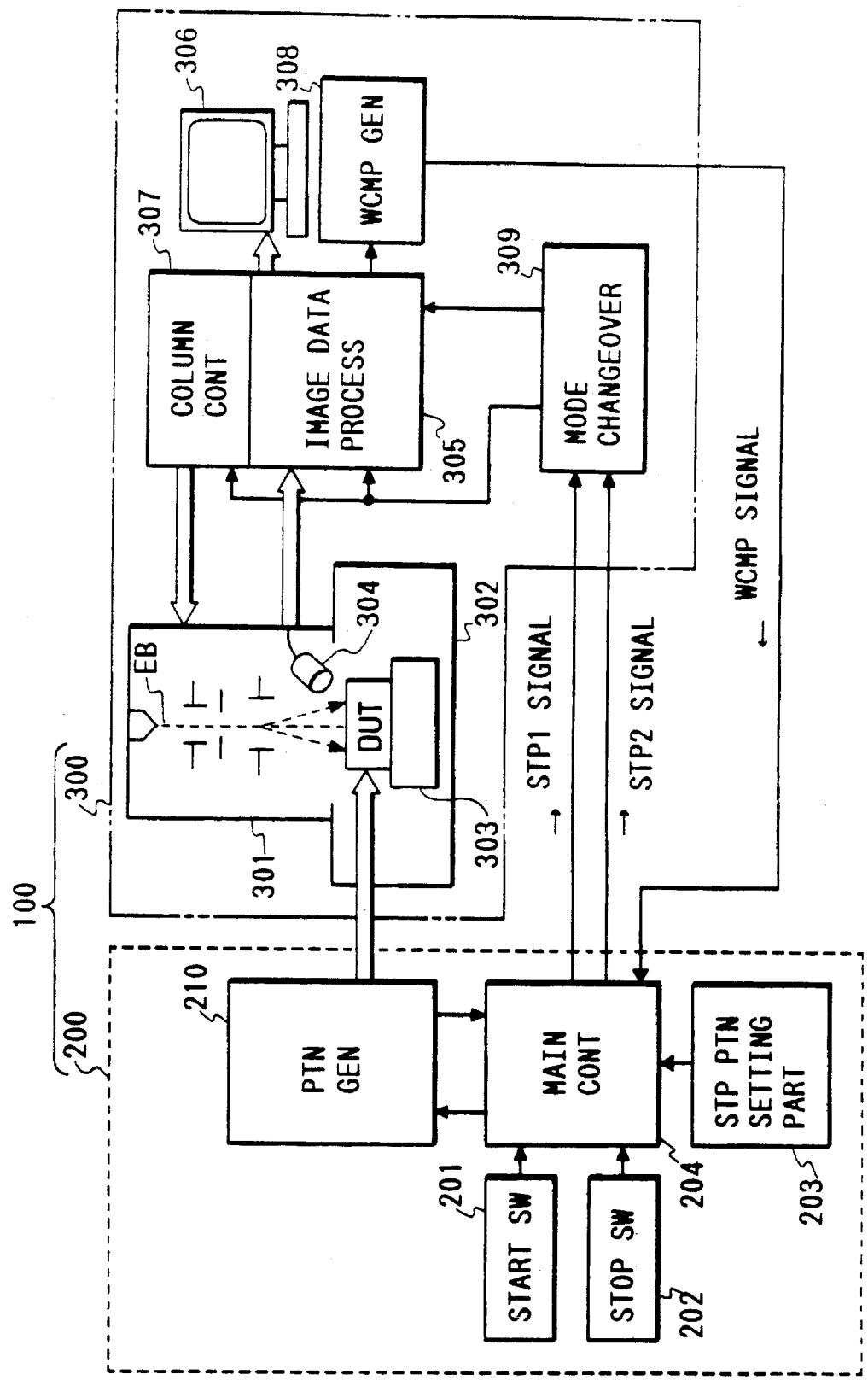
FIG. 7 is a block diagram illustrating an embodiment of the IC analysis system according to the second aspect of the present invention.
Figure 8:
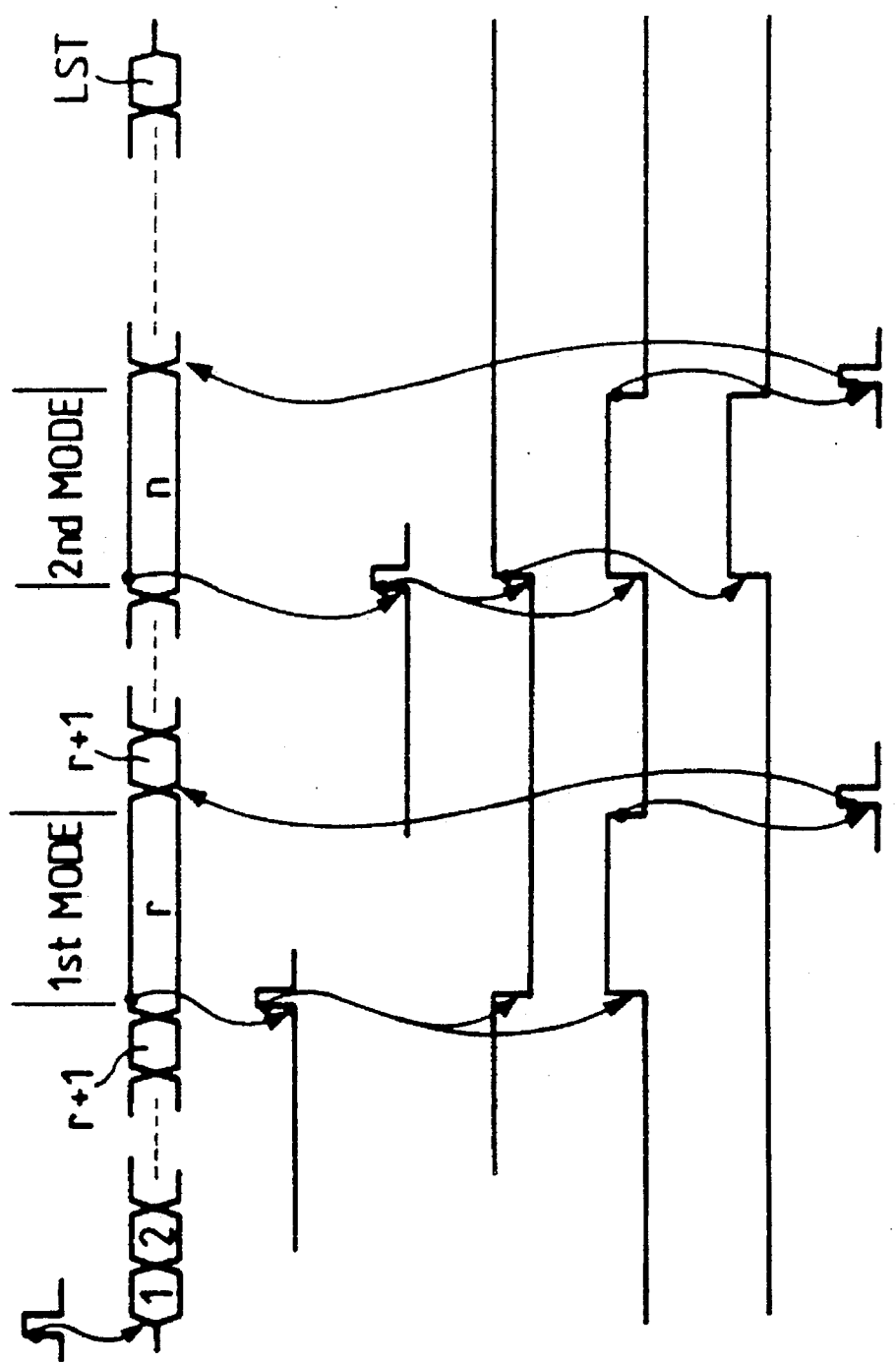
FIGS. 8A–H are waveform diagrams for explaining an example of operation of the FIG. 7 embodiment.
Figure 9:
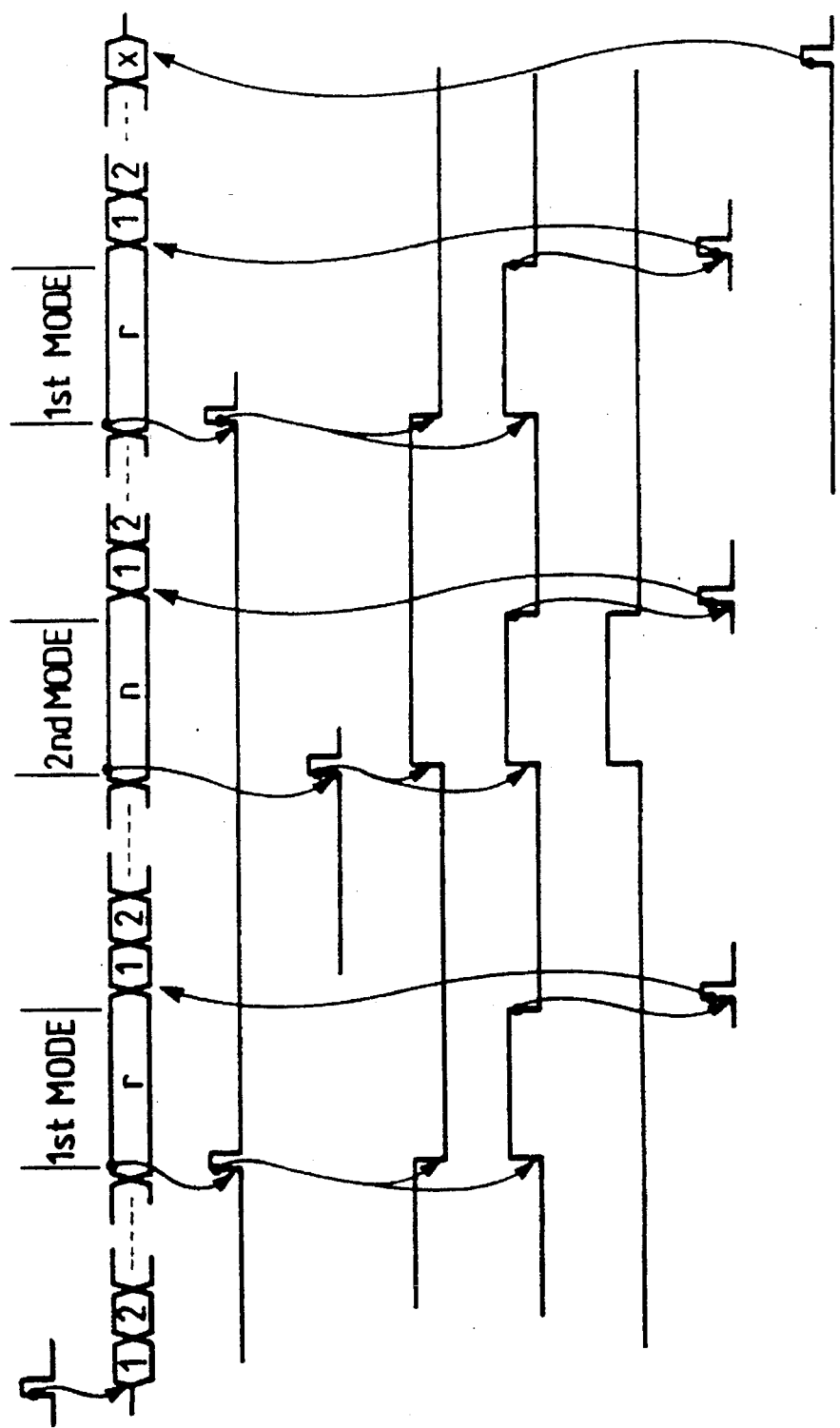
FIGS. 9A–I are waveform diagrams for explaining another example of operation of the FIG. 7 embodiment.

FIG. 7 illustrates, in block from, embodiments of the electron beam probe system and the IC analysis system using the same according to the second aspect of the present invention. In the FIG. 7 embodiment, the stop pattern setting part 203 is adapted to permit setting therein of first and second test patterns r and n and a mode changeover part 309 is provided in the electron beam probe system 300. Upon each generation of either of the first and second test patterns r and n by the pattern generator 210, the main control part 204 controls the pattern generator 210 to temporarily stop its pattern updating operation and, at the same time, generates stop signals STP1 and STP2, respectively. As is the case with the FIG. 3 embodiment, the pattern generator 210 resumes the pattern updating operation when tile write completion signal WCMP (or a sweeping irradiation completion signal) is output from the write completion signal generator 308. Alternatively, it is possible to omit the write completion signal generating part 308 and resume the pattern updating after a predetermined period of time so long that it can be judged that the sweeping irradiation by the electron beam in the electron beam probe system has been completed after the generation of the stop signals STP1 and STP2 by the main control part 204.

The mode changeover part 309 effects control of switching between a first operation mode in which, in response to the stop signal STP1 that the main control part 204 generates at the same time as it causes the test pattern generator 210 to temporarily stop the test pattern updating operation when the first test pattern r is generated, the column control part 307 is caused to perform the sweeping irradiation with the electron beam EB but the image data processor 305 does not acquire image data, and a second operation mode in which, in response to the stop signal STP2 that the main control part 204 generates at the same time as it causes the test pattern generator 210 to temporarily stop the test pattern updating operation when the second test pattern n is generated, the column control part 307 is caused to perform the sweeping irradiation with the electron beam EB and the image data processor 305 is caused to acquire image data.

FIGS. 8A–H and 9A–I show examples of the execution of the first and second operation modes in different pattern generating sequences. FIGS. 8A–H show the case of generating the test pattern continuously from the leading address to the last address LST and executing the first and second operation modes for the patterns r and n that are generated in that while. FIG. 9A–I show the case of returning the operation to the leading address upon each execution of the first and second operation modes. In either case, the write completion signal generating part 308 is provided. By acquiring the image data in the second operation mode after the first operation mode, it is possible to eliminate the influence of decreased potential contrast in the surface (the insulating film) of the device under test DUT.

That is, by irradiating the device under test DUT with the electron beam EB in the first operation mode, the surface potential of the device under test DUT is set to a potential contrast based on the test pattern. By generating the test pattern n while applying this potential contrast, a potential contrast image is repeatedly formed only in a portion where there is a wiring conductor which is supplied with a potential of a different polarity when the test patterns r and n are applied, respectively. Thus, the potential contrast image are accumulated, and hence a clear potential contrast image can be obtained.

Figure 10:
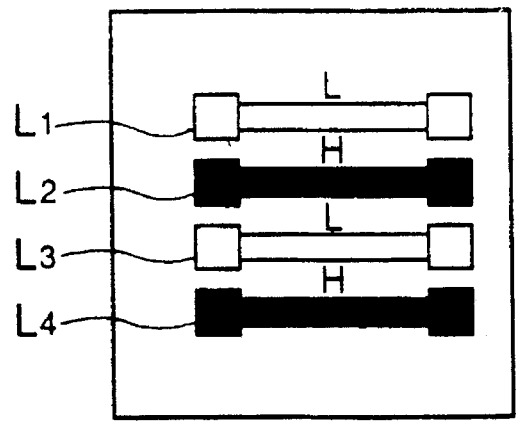
FIG. 10 is a diagram showing examples of potentials that are applied to wiring conductors by a pattern r.
Figure 11:
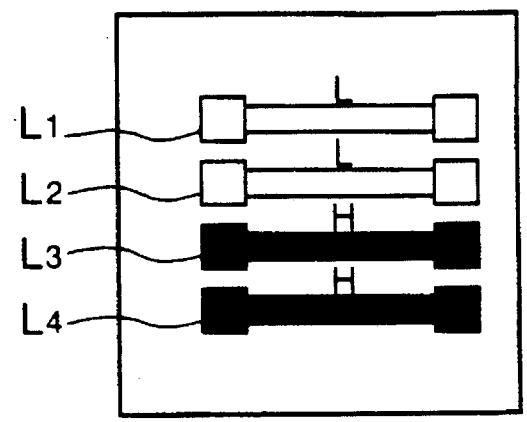
FIG. 11 is a diagram showing examples of potentials that are applied to wiring conductors by a pattern n.

FIGS. 10 through 13A–E show how a clear potential contrast image is formed. FIG. 10 shows potentials that are applied to the conductors $L_1$, $L_2$, $L_3$ and $L_4$ when the first test pattern r is applied. The FIG. 10 example shows the state of applying L-logic to the conductor $L_1$, H-logic to the conductor $L_2$, L-logic to the conductor $L_3$ and H-logic to the conductor $L_4$. FIG. 11 shows potentials that are applied to the conductors $L_1$ through $L_4$ when the second test pattern n is applied. The FIG. 11 example shows the state of applying L-logic to the conductors $L_1$ and $L_2$ and H-logic to the conductors $L_3$ and $L_4$.

Figure 12:
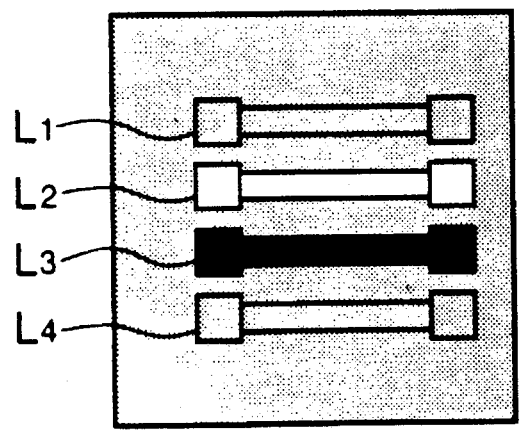
FIG. 12 is a diagram showing examples of potential contrast images that are formed by the irradiation with an electron beam in the case of using the pattern n.

In the state of FIG. 10 the area containing the conductors $L_1$ through $L_4$ is subjected to sweeping irradiation with the electron beam EB but no image data is acquired, after which the test pattern is updated and when the second pattern n is reached, the pattern updating operation is temporarily stopped. By sweeping and irradiating the above-said area with the electron beam EB in the state of FIG. 11 wherein the second test pattern n is being applied and by acquiring the image data at that time, it is possible to obtain such potential contrast images as shown in FIG. 12. As shown in FIG. 12, only those conductors of potentials which are reversed in logic by the application of the first test pattern r and the second test pattern n appear as potential contrast images. In this example, the conductors $L_2$ and $L_3$ appear as potential contrast images, whereas the conductors $L_1$ and $L_4$ are each supplied with the same potential, and hence are not displayed as potential contrast images.

Figure 13A:
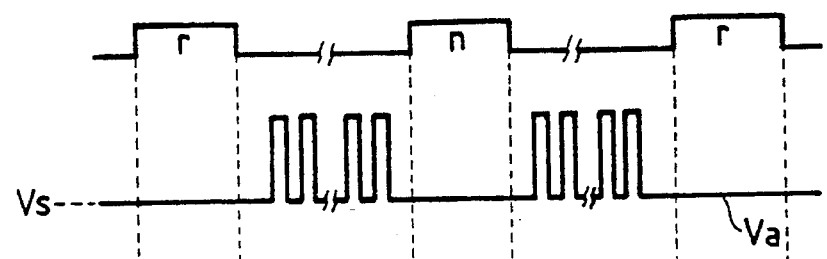

The reason for it will be given using FIGS. 13A–E. Incidentally, assume that the sweeping irradiation with the electron beam EB has already been repeated for the pair of patterns r and n. Since the conductors $L_1$ and $L_4$ are supplied with L-logic and H-logic, respectively, in both cases of the patterns r and n, their surface potentials remain Vs in either case as shown in FIG. 13B. When the first test pattern r is applied, the conductors $L_2$ and $L_3$ are supplied with H-logic and L-logic potentials which are reverse in logic from those when the previous pattern n was applied, hence the potentials of the insulating film covering these conductors $L_2$ and $L_3$ are biased positively and negatively in excess of the equilibrium potential Vs (equivalent to the potential of the surrounding insulator) indicated by the broken lines.

When sweeping and irradiating the device under test DUT with the electron beam EB in this state, the potentials of those portions of the insulating film overlying the conductors $L_2$ and $L_3$ gradually vary toward the equilibrium potential Vs. On the other hand, the potentials of those portions of the insulating film overlying the conductors $L_1$ and $L_4$ remain at Vs. During the irradiation with the electron beam EB the potential of the insulating film undergoes a change, but when the irradiation is stopped, the potential change does not occur. Although several test patterns are applied in the interval between the first and second test patterns r and n, potentials Va, Vb, Vc and Vd reached as the result of irradiation with the electron beam EB during the application of the pattern r are held unchanged to a time immediately prior to the application of the pattern n.

When the irradiation with the electron beam EB is resumed in the state in which the second test pattern n is generated and applied to the conductors $L_1$ through $L_4$, the potentials of those portions supplied with potentials reverse in logic from those supplied previously (the conductors $L_2$ and $L_3$) are shifted to potentials Ve and Vf far apart from the equilibrium potential Vs and start to vary therefrom, but the potentials of those portions supplied with the potentials of the same logic as before remain at the equilibrium potential Vs. Hence, in the state wherein the second test pattern n is being applied, the portions of the conductors $L_1$ and $L_4$ are displayed as potential contrast images in the same gray color as the surrounding areas, whereas the portions of the conductors $L_2$ and $L_3$ are displayed as bright and dark potential contrast images, respectively, as depicted in FIG. 12.

As described above, according to the second aspect of the present invention, by applying the second test pattern n after the first test pattern r, it is possible to obtain, at all times, a potential contrast image on the conductor which, at the time of application of the second test pattern n, was supplied with a voltage reverse in logic from that supplied at the time of application of the first test pattern r. Hence, by acquiring this potential contrast image as image data upon each generation of the second test pattern n, image data can be accumulated. Moreover, a clear potential contract image of improved SN ratio can be obtained by averaging image data acquired a plurality of times for the test pattern n through repetition of such a procedure. By changing the first test pattern r to new ones in a sequential order, the conductors whose logic is reversed at the time of applying the test pattern n can be changed one after another. This permits observation of the conditions of almost all the conductors.

Thus, according to the second aspect of the present invention, the stop pattern setting part 203 is so adapted as to set the first and second test patterns r and n, and the conductor portion, supplied with voltages reverse in logic when the first and second test patterns r and n are applied respectively, is always displayed as a potential contrast image upon each suspension of the pattern updating operation when the second test pattern n is applied. Hence, such a potential contrast image can be obtained repeatedly. Consequently, a clear image could be obtained by averaging a plurality of potential contrast images—this also facilitates the analysis of a fault.

Furthermore, according to the second aspect of the present invention, since the potential contrast image that is obtained everytime is limited to the conductor portion supplied with voltages reverse in logic when the first and second test patterns are applied respectively, the potential contrast image is fixed, and hence can clearly be seen all over it. In other words, an image easy to observe can be obtained. In this instance, however, it is also possible to obtain a potential contrast image of an unseen portion by changing the first test pattern to new ones in a sequential order. That is, potential contrast images of all conductors can be obtained by sequentially changing the first test pattern to new ones and synthesizing respective potential contrast images.

As described above, the potential contrast image is obtained by sweeping and irradiating one area of the device under test DUT with an electron beam while applying thereto a desired test pattern and by acquiring the quantity of secondary emission as image data. In the case of an IC chip covered all over its surface with an insulating film, however, there is a phenomenon that the potential distribution formed on the insulating film disappears in proportion to the quantity of irradiation by the electron as described previously. On this account, the SN ratio of the potential contrast image can only slightly be improved even by acquiring the image data a plurality of times.

One possible solution to this problem is to update test patterns one after another and continue the sweeping irradiation with the electron beam EB until the specific test pattern n is reached. With this method, since the IC chip is irradiated with the electron beam while the test patterns are updated at high speed, the potential of the insulating film covering the surface of the IC chip assumes a mean value of potential variations of the wiring conductors, that is, an intermediate value between the H-logic and the L-logic. When the pattern updating operation stops upon generation of the specified test pattern n, the potential distribution dependent on the test pattern can be acquired as a potential contrast image. By resuming the pattern updating operation after acquiring the image data and further continuing the sweeping irradiation with the electron beam, the potential of the insulating film takes again the intermediate value between the H-logic and the L-logic.

By repeating this, the potential contrast image in the state of the desired test pattern being applied can be obtained repeatedly. This increases the quantity of image data, and the picture quality of the potential contrast image can be enhanced by averaging the image data thus acquired.

Yet, this method has such a defect as mentioned below. That is, as will be seen from the description given above, according to the potential immediately prior to the suspension of the pattern updating operation upon generation of a desired test pattern, some wiring conductors appear as potential contrast images but some do not; this is not desirable for the fault analysis.

Figure 14:
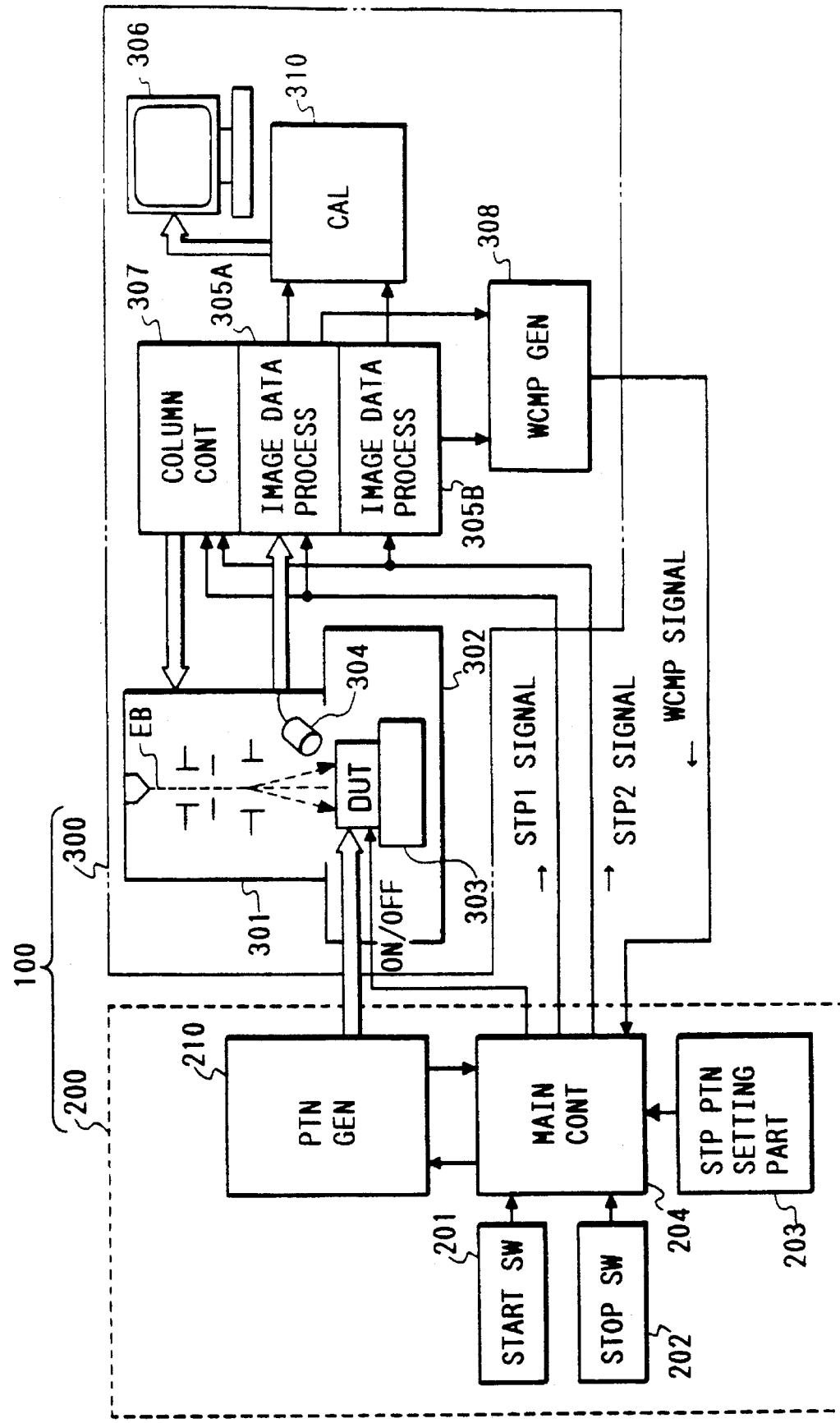
FIG. 14 is a block diagram illustrating an embodiment of the IC analysis system according to the third aspect of the present invention.

FIG. 14 illustrates, in block form, the electron beam probe system according to the third aspect of the present invention and an embodiment of the IC analysis system using the same. The parts corresponding to those in FIG. 7 are identified by the same reference numerals. The structural feature of the third aspect of the invention resides in that the electron beam probe system 300 includes a plurality of image data processing parts 305A and 305B and a calculating part 310 for obtaining the difference between image data acquired by the image data processing parts 305A and 305B. Also in this embodiment, the write completion signal generating part 308 may be provided which generates the write completion signal WCMP representing the completion of acquisition of image data. This embodiment will be described in connection with the case where the write completion signal generating part 308 is provided, but it is also possible to employ a construction wherein the write completion signal generating part 308 is omitted and the main control part 204 temporarily stops the pattern updating operation upon detecting that the predetermined patterns r and n are each reached, and resumes the pattern updating operation a predetermined period of time (longer than the image data acquiring period) after the generation of the stop signals STP1 and STP2.

When detecting that either the image data processing part 305A or 305B has completed the acquisition of image data, the write completion signal generating part 308 generates the write completion signal WCMP, which is applied to the main control part 204 provided in the IC tester 200. The main control part 204 responds to the write completion signal WCMP to supply the test pattern generator 210 with a command for resuming the pattern updating operation. Thus, the test pattern generator 210 is released from the stopped stat and resumes the pattern updating operation.

According to the third aspect of the invention, assuming that the stop patterns r and n, for example, are set in the stop pattern setting part 203, whenever the stop pattern r or n is generated, the main control part 204 controls the test pattern generator 210 to stop it from the test pattern updating operation, holding it in the state of outputting the test pattern r or n. FIG. 15A–H show this. In FIG. 15A shows a start signal and Row B a test pattern signal. When the pattern of the test pattern signal reaches r or n, the main control part 204 causes the test pattern generator 210 to stop the pattern updating operation and holding it in the state of outputting the pattern r or n. At the same time, the main control part 204 yields the stop signal STP1 or STP2, which is applied to the image data processing part 305, causing it to start the acquisition of image data. FIG. 15F shows the image data acquisition period.

As is the case with the embodiment described previously, the completion of image data acquisition can be known, for example, by detecting a vertical blanking signal indicating that one frame has been irradiated with the electron beam EB. By generating the write completion signal WCMP upon detection of one or desired number of vertical blanking signals, the write completion signal WCMP can be produced when the electron beam EB has scanned one or desired number of frames. FIG. 15G shows the write completion signal WCMP. Where the write completion signal generating part 308 is not used, the pattern updating operation may be resumed, judging a certain elapsed time after the generation of the stop signal STP1 or STP2 that the image data acquisition has been completed.

By the application of the write completion signal WCMP to the main control part 204, the test pattern generator 210 is released from the stopped state and updates the test pattern to r+1, r+2, . ., or n+1, n+2, . . and outputs the last pattern LST as shown in FIG. 15B. In the case where the generation of a series of test patterns (1 through LST) is set to once, the test pattern generator 210 stops in the state of outputting the last pattern LST.

In the case where the test pattern generator 210 is set to continue the pattern generation and resume the pattern updating operation at the leading pattern after the acquisition of image data is set to resume at the leading pattern, it automatically stops after the generation of the test pattern r and returns to and restarts at the leading pattern after the completion of the acquisition of image data by the image data processing part 305A; in the next cycle, the test pattern generator 210 stops at the test pattern n and, after the image data acquisition by the image data processing part 305B, returns to the leading test pattern and repeats generating patterns, as shown in FIGS. 16A–I In this way, pieces of image data available during the application of the specified test patterns r and n can automatically be acquired into the image data processing parts 305A and 305B in a plurality of times. The generation of the test pattern can be stopped by the stop switch 202.

As described above, according to the third aspect of the present invention, pieces of image data at the time of applying different test patterns are taken into the image data processing parts 305A and 305B. That is, the image data in the state of the test pattern r being applied to the device under test DUT is taken into the image data processing part 305A, and the image data in the state of the test pattern n being applied to the device under test DUT is taken into the image data processing part 305B. The difference image data may also be obtained by a procedure wherein the image data processing part 305A provided to the calculating part 310 an inverted version of the image data for the test pattern r read out from the internal memory and the calculating part 310 creates image data which is the sum of the inverted version of the image data for the pattern r and the image data for the pattern n and provides the sum image data to the monitor 306.

The pieces of image data fetched into the image data processing parts 305A and 305B are provided to the calculating part 310, wherein image data corresponding to the difference between the two pieces of image data is created. By displaying the difference image data on the monitor 306, the potential contrast image (a difference potential contrast image) becomes a clear image. The reason for this will be given below.

As is the case with FIGS. 10 and 11, let it be assumed that the potentials L, H, L and H are applied to the wiring conductors $L_1$, $L_2$, $L_3$ and $L_4$ in the device under test DUT when the test pattern r is applied and that the potentials L, L, H and H are applied to the conductors $L_1$, $L_2$, $L_3$ and $L_4$ when the test pattern n is applied.

Figure 17A:
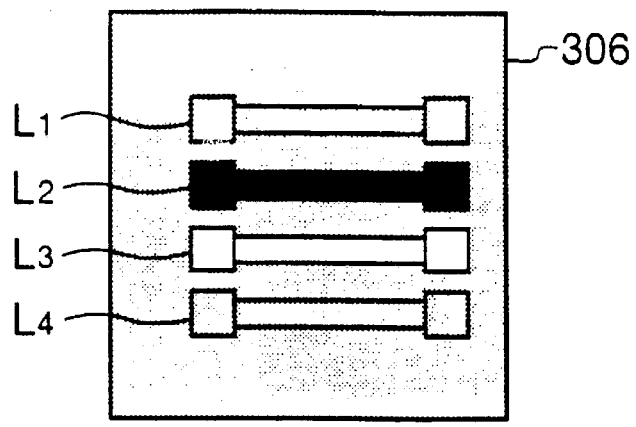
FIG. 17A is a diagram showing potential contrast images obtainable by the application of the test pattern r after the alternate application of the test patterns r and n.
Figure 17B:
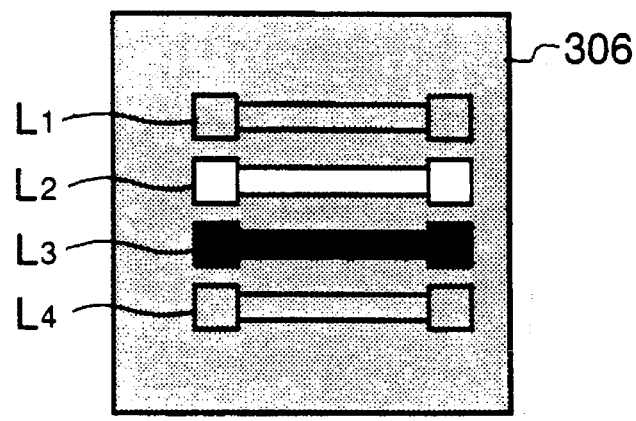
FIG. 17B is a diagram showing potential contrast images obtainable by the application of the test pattern n after obtaining the image data depicted in FIG. 17A.

FIGS. 17A and 17B show potential contrast images obtained during the application of the test patterns r and n after the repetition of the electron beam irradiation therefor. These potential contrast images are available during the application of the patterns r and n shown in FIGS. 13A–E and hence the images in FIG. 17B are the same as those shown in FIG. 12. Of the potential contrast images depicted in FIGS. 17A and 17B, the potential contrast images of the conductors $L_1$ and $L_4$ both disappear and only the potential contrast images of the conductors $L_2$ and $L_3$ are left remaining. The reason for this is that the conductors $L_1$ and $L_4$ are each supplied with the same potential when the test pattern r is applied and when the test pattern n is applied, as mentioned previously. On the other hand, since the logic of the potential that is applied to the insulating film overlying the conductors $L_2$ and $L_3$ is reversed each time the test patterns r and n are applied, potential contrast images reverse in logic are formed upon each application of the test patterns r and n.

Figure 17C:
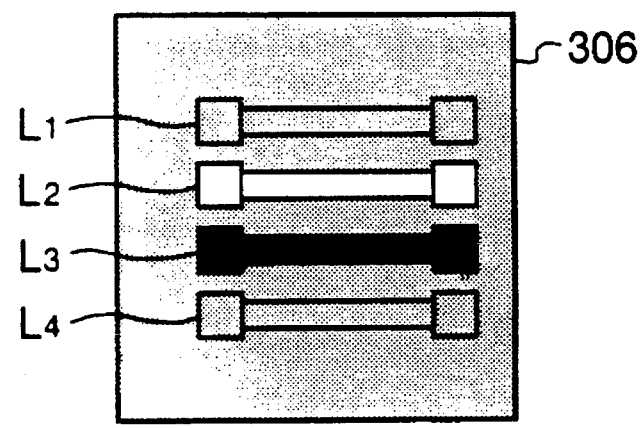
FIG. 17C is a diagram showing potential contrast images by image data corresponding to the difference between pieces of image data in FIGS. 17A and 17B.
Figures 19A, 19B, 19C, 19D, 19E, 19F, 19G, 19H:
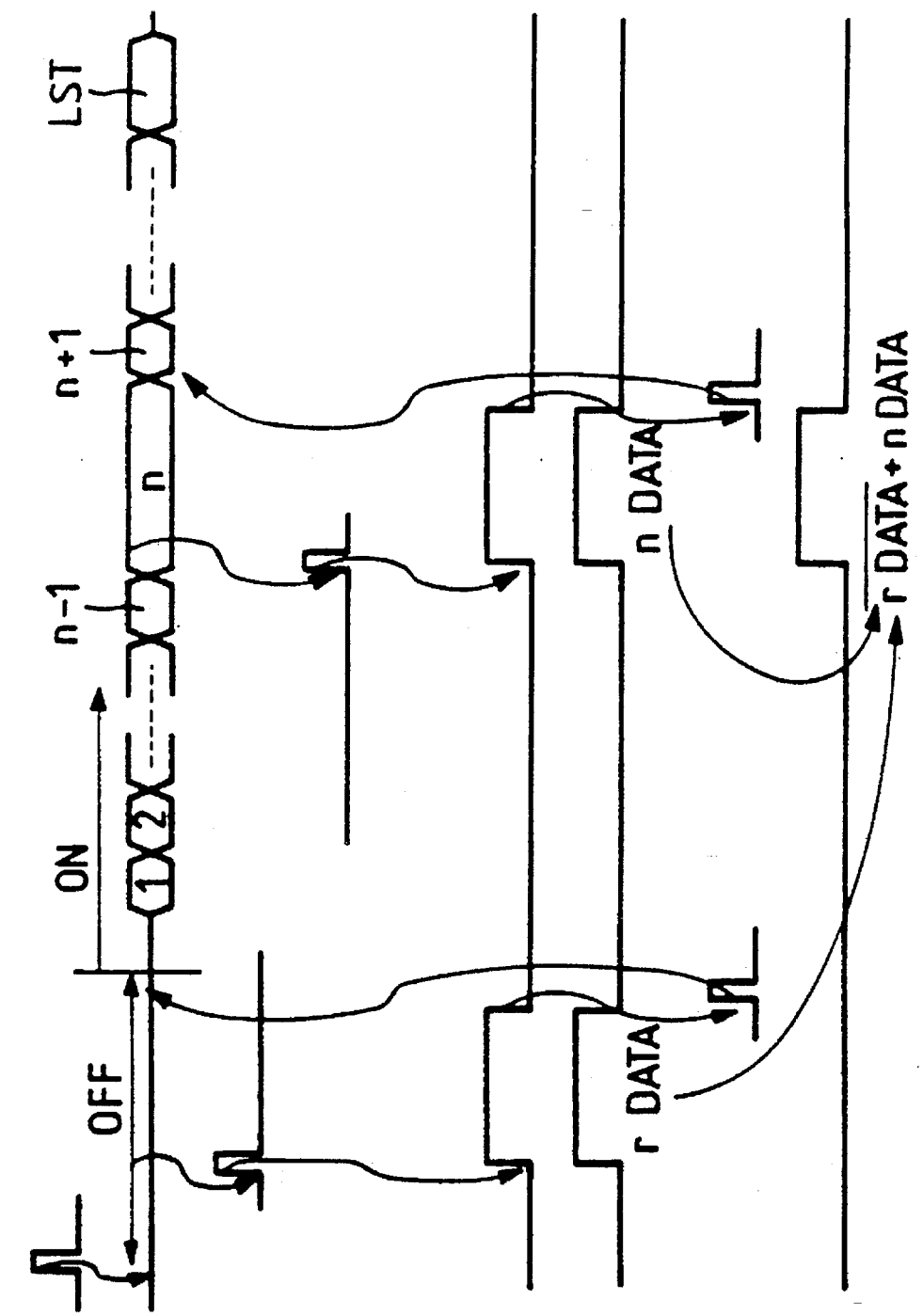
FIGS. 19A–H are timing charts for effecting the fault locating method according to the fourth aspect of the present invention.

Thus, according to the third aspect of the present invention, the potential contrast of each of the conductors $L_2$ and $L_3$ is emphasized as shown in FIG. 17C, by obtaining with the calculating part 310 the difference between the pieces of image data taken into the image data processing parts 305A and 305B for the patterns r and n. By displaying the difference image data on the monitor 306, the quality of the display image is increased and its resolution is also enhanced.

Furthermore, according to the third aspect of the present invention, it is possible to display the difference between the potential contrast images available in the state of the first test pattern being applied and in the state of the second test pattern being applied; therefore, only a failed portion can be displayed as a potential contrast image, for instance, by setting the first and second test patterns to the same pattern and using different conditions for the first and second image data acquiring operations. That is, the device under test DUT is operated on a normal voltage of 5 V for the first image data acquiring operation and on 6.0 V for the second image data acquiring operation. In the case of operating the device under test DUT on 6.0 V, if an abnormality develops in operation, only a portion where a potential different from the previous one is induced is displayed in the potential contrast image. In other words, only a failing portion is displayed, and hence can immediately be specified.

As described above, according to the third aspect of the present invention, different test patterns, for instance, r and n, are applied alternately with each other and the difference between the pieces of image data of the resulting potential contrast images is displayed; hence, the quality of the image can be increased higher than the potential contrast image that is formed in the state of either one of the test patterns r and n being applied. As the result of this, the potential distributions of the wiring conductors in the IC chip can be analyzed with high accuracy and a failed portion can be located in a short time.

By holding the test pattern n intact but selecting other test patterns as the test pattern r, it is possible to observe potential contrast images of other conductors unobtainable with the combination of the test patterns r and n. Moreover, only an abnormally operating portion can selectively be displayed by repeatedly applying the same test pattern n, for example, and changing, for instance, the power supply voltage to the device under test DUT upon each application of the test pattern or the drive voltage by the applied pattern, and then displaying the difference potential contrast image. Hence, in this instance the failed portion can directly be specified.

As described previously with reference to the FIG. 14 embodiment, when the potential of the wiring conductor is reversed in logic upon each application of the test patterns r and n, potential contrast of reverse logic is produced in the insulating film overlying the conductor when the test patterns r and n are each applied. By obtaining image data corresponding to pieces of image data for these patterns r and n, the potential contrast is emphasized and the SN ratio is improved; hence, a difference contrast image of excellent resolution can be obtained. As will be seen from FIGS. 13A–E, 17A, 17B and 17C, when potentials of the same logic are provided for the test patterns r and n, a gray difference contrast image is obtained; when L-logic and H-logic are provided for the test patterns r and n, respectively, a black difference contrast image is obtained; and when H-logic and L-logic are provided for the test patterns r and n, respectively, a white difference contrast image is obtained. By comparing difference contrast images for the applied logical signal for respective corresponding wiring conductors of a non-defective IC and a defective IC through utilization of the above-mentioned combinations, a fault of the IC under test can be specified.

In Table I of FIG. 18 there are shown the presence or absence of the difference between difference contrast images of a non-defective IC and a defective IC and the presence or absence of a fault isolation problem in connection with all possible combinations of logical patterns of corresponding wiring conductors of the both ICs. In items No. 3, No. 8, No. 9 and No. 14, the logical signals to the corresponding wiring conductors of the both ICs are the same, and hence the difference contrast images naturally become the same. A fault isolation problem is presented in items No. 2 and No. 11. That is, although the test patterns for the corresponding wiring conductors of the non-defective and defective ICs have different logical levels, the difference contrast images do not differ. A description will be given of a solution to this problem according to the present invention.

With reference to FIGS. 19A–H, the method according to the present invention will be described as being applied to the embodiment of FIG. 14. According to this method, the power supply to the device under test DUT is held OFF, the state of no test pattern being applied is regarded as if the first test pattern r of all L-level is applied, the surface of the device under test DUT is swept and irradiated with the electron beam EB in the power OFF period and then image data is taken into the image data processing part 305A. The main control part 204 effects ON/OFF control of the power supply to the device under test DUT and outputs the stop signal STP1 upon initiation of the power OFF period. During the power OFF period all wiring conductors of the device under test DUT are at the L-logic level. When the column control part 307 performs the sweeping irradiation of the device under test DUT with the electron beam in the power OFF period and the image data processing part 305A completes the data acquisition, the write completion signal generating part 308 generates the write completion signal WCMP. The main control part 204 responds to the signal WCMP to turn ON the power supply to the device under test DUT and starts the test pattern generator 210. When the test pattern n is generated, the power supply is in the ON state and the pattern n is applied as described previously with reference to FIG. 14 and in that the state the image data of the potential contrast images of the device under test DUT is taken into the image data processing part 508B. The difference between the pieces of image data read out of these image data processing part 508A and 508B is calculated by the calculating part 310 and provided as difference contrast image data to the monitor 306. In Table II of FIG. 20 there are shown respective difference contrast images of the non-defective and defective ICs obtained by this method, the presence or absence of a difference between the contrast images and the fault isolation capability.

With the above-described method, the both non-defective and defective ICs are fixed at the L-logic level during the power supply OFF period which is the virtual test pattern r application period, and as is evident from Table II, the number of logical combinations of the patterns r and n in each wiring conductor is only four. When the logical combination in the wiring conductor of the defective IC is the same as in the non-defective IC, the resulting difference contrast images are identical, and if the logical combination in the defective IC differs from that of the non-defective IC (that is, if a fault exists), then the difference contrast images also differ. Thus, a fault of the defective IC can always be detected as a difference in the difference contrast image from that of the non-defective IC. Incidentally, the operation of FIGS. 19-H may be modified so that after completion of the acquisition of image data resulting from the application of the test pattern n the operation returns to the virtual test pattern r (i.e. the power supply OFF period) as shown in FIGS. 21A–I.

As described above, according to the fourth aspect of the present invention, the image data during the power supply OFF period and image data by the desired test pattern n are taken into the image data processing parts 305A and 305B, respectively, and the difference image data is calculated and displayed, by which a faulty portion of the IC under test can be displayed in distinction from the corresponding portion of the non-defective IC.

It will be apparent that many modifications and variations may be effected without departing from the scope of the novel concepts of the present invention.

What is claimed is:

1. An integrated circuit analysis system comprising:
    an electron beam probe system which scans and irradiates a surface of a device under test with an electron beam, measures a quantity of secondary emission from an irradiated point, and displays a potential distribution on the surface of said device under test; and
    an integrated circuit tester which applies a test pattern signal comprising a series of test patterns to said device under test, said IC tester comprising:
        a test pattern generator which generates a test pattern signal comprising a series of test patterns and sequentially updates and applies the test patterns of said test pattern signal to said device under test,
        stop pattern setting means for setting therein at least a first test pattern and a second test pattern among the test patterns of said test pattern signal as update stopping test patterns for temporarily stopping said test pattern generator from updating one of said first test pattern and said second test pattern generated by said test pattern generator, respectively, and
        main control means for controlling, when said test pattern generator generates one of said first test pattern and said second test pattern, said test pattern generator to temporarily stop from updating said one test pattern and to hold said test pattern generator in a state of continuing to output said one test pattern being applied to said device under test, and concurrently outputting a first pattern update stop signal representing a pause of the test pattern updating operation of said test pattern generator when said test pattern generator generates said first test pattern as well as outputting a second pattern update stop signal representing a pause of the test pattern updating operation of the said test pattern generator when said test pattern generator generates said second test pattern; and
    said electron beam probe system comprising:
        at least two image data processing means each of which acquires an image data from the surface of said device under test on receiving one of said first pattern update stop signal and said second pattern update stop signal from said main control means;
        calculating means for calculating a difference between said image data acquired by said at least two image data processing means; and
        a monitor displaying image data of said difference calculated by said calculating means.

2. The integrated circuit analysis system according to claim 1, wherein said electron beam probe system further comprises write completion signal generating means for generating a write completion signal representing that each said image data processing means has completed the acquisition of said image data, and wherein said main control means controls, upon receiving said write completion signal from said write completion signal generating means, said test pattern generator to resume said test pattern updating operation.

3. The integrated circuit analysis system according to claim 1 wherein said main control means controls said test pattern generator to resume said test pattern updating operation when a predetermined period of time has elapsed after the generation of each of said first pattern update stop signal and said second pattern update stop signal, said predetermined period of time being set to a time period within which each of said image data processing means can thoroughly acquire the image data from the device under test.

4. An electron beam probe system which scans and irradiates a surface of a device under test with an electron beam, said device under test being supplied with test pattern signal comprising a series of test patterns generated from and sequentially updated by an integrated circuit tester, measures a quantity of secondary emission from an irradiated point, and displays a surface potential distribution of said device under test as an image, comprising:

image data processing means for acquiring image data from said device under test; and mode changeover means for switching between a first operation mode in which said image data processing means is inhibited from acquiring image data from said device under test in response to a first pattern update stop signal from the integrated circuit tester for temporarily stopping the integrated circuit tester from updating the test pattern currently being generated therefrom, and concurrently said device under test is subjected to scanning of irradiation with an electron beam, and a second operation mode in which said image data processing means acquires image data from said device under test in response to a second pattern update stop signal from the integrated circuit tester for temporarily stopping the integrated circuit tester from updating the test pattern currently generated therefrom, and concurrently said device under test is subjected to said scanning of irradiation with the electron beam.

5. The electron beam probe system according to claim 4, further comprising write completion signal generating means for generating a write completion signal representing that said image data processing means has completed the acquisition of image data and, providing said write completion signal to the integrated circuit tester.

6. The electron beam probe system according to claim 4 wherein the integrated circuit tester resumes the test pattern updating operation when a predetermined period of time has elapsed after generation of each of the first pattern update stop signal and the second pattern update stop signal, said predetermined period of time being set to a time period within which said image data processing means can thoroughly acquire the image data from the device under test.

7. An integrated circuit analysis system comprising:

a charged particle beam probe system which scans and irradiates a surface of a device under test with a charged particle beam, measures a quantity of secondary emission from an irradiated point, and displays a potential distribution on the surface of said device under test; and an integrated circuit tester which applies a test pattern signal comprising a series of test patterns to said device under test, said integrated circuit tester comprising:

a test pattern generator which generates a test pattern signal comprising a series of test patterns and sequentially updates and applies the test patterns of said test pattern signal to said device under test;

stop pattern setting means for setting therein at least a first test pattern and a second test pattern among the test patterns of said test pattern signal as update stopping test patterns for temporarily stopping said test pattern generator from updating said first test pattern and said second test pattern generated by said test pattern generator, respectively, and main control means for controlling, when said test pattern generator generates one of said first test pattern and said second test pattern, said test pattern generator to temporarily stop from updating said one of said first test pattern and said second test pattern and to hold said test pattern generator to continuously output said one of said first test pattern and said second test pattern being applied to said device under test, and concurrently outputting a first pattern update stop signal representing a pause of the test pattern updating operation of said test pattern generator when said test pattern generator generates said first test pattern as well as outputting a second pattern update stop signal representing a pause of the test pattern updating operation of said test pattern generator when said test pattern generator generates said second test pattern; and said charged particle beam probe system comprising:

at least two image data processing means each of which acquires an image data from the surface of said device under test on receiving one of said first test pattern stop signal and said second pattern update stop signal from said main control means;

calculating means for calculating difference between image data acquired by said at least two image data processing means; and a monitor for displaying image data of said difference calculated by said calculating means.

8. A charged particle beam probe system which scans and irradiates a surface of a device under test with a charged particle beam, said device under test being supplied with a test pattern signal comprising a series of test patterns generated from and sequentially updated by an integrated circuit tester, measures a quantity of secondary emission from an irradiated point, and displays a surface potential distribution of said device under test as an image, comprising:

image data processing means for acquiring image data from said device under test; and mode changeover means for switching between a first operation mode in which said image data processing means is inhibited from acquiring image data from said device under test in response to a first pattern update stop signal from the integrated circuit tester for temporarily stopping the integrated circuit tester from updating the test pattern currently generated therefrom, and concurrently said device under test is subjected to scanning of irradiation with a charged particle beam, and a second operation mode in which said image data processing means acquires image data from said device under test in response to a second pattern update stop signal from the integrated circuit tester for temporarily stopping the integrated circuit tester from updating the test pattern currently generated therefrom, and concurrently said device under test is subjected to scanning of irradiation with the charged particle beam.

* * * * *